(12) United States Patent
Peng et al.

(10) Patent No.: US 10,770,345 B2
(45) Date of Patent: Sep. 8, 2020

(54) INTEGRATED CIRCUIT AND FABRICATION METHOD THEREOF

(71) Applicant: TAIWAN SEMICONDUCTOR MANUFACTURING CO., LTD., Hsinchu (TW)

(72) Inventors: Tai-Yen Peng, Hsinchu (TW); Chang-Sheng Lin, Hsinchu County (TW); Chien-Chung Huang, Taichung (TW); Yu-Shu Chen, Hsinchu (TW); Sin-Yi Yang, Taichung (TW); Chen-Jung Wang, Hsinchu (TW); Han-Ting Lin, Hsinchu (TW); Chih-Yuan Ting, Taipei (TW); Jyu-Horng Shieh, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/112,955

(22) Filed: Aug. 27, 2018

(65) Prior Publication Data
US 2020/0066580 A1 Feb. 27, 2020

(51) Int. Cl.
| | |
|---|---|
| *H01L 43/12* | (2006.01) |
| *G11C 11/16* | (2006.01) |
| *H01L 27/22* | (2006.01) |
| *H01L 43/02* | (2006.01) |
| *H01L 43/08* | (2006.01) |
| *H01L 21/768* | (2006.01) |
| *H01L 21/3105* | (2006.01) |
| *H01L 27/24* | (2006.01) |

(52) U.S. Cl.
CPC .. *H01L 21/76819* (2013.01); *H01L 21/31056* (2013.01); *H01L 27/228* (2013.01); *H01L 27/2436* (2013.01); *H01L 43/02* (2013.01); *H01L 43/12* (2013.01); *H01L 21/76802* (2013.01)

(58) Field of Classification Search
CPC ......... H01L 21/31051; H01L 21/31053; H01L 21/31055; H01L 21/31056; H01L 21/76819; H01L 27/222; H01L 27/228; H01L 43/02; H01L 43/12
See application file for complete search history.

(56) References Cited

U.S. PATENT DOCUMENTS

| | | | | |
|---|---|---|---|---|
| 2012/0214316 A1* | 8/2012 | Bae | ............ | H01L 21/31053 438/763 |
| 2015/0179612 A1* | 6/2015 | Tsai | ............ | H01L 21/76877 257/773 |
| 2017/0194557 A1* | 7/2017 | Chuang | ............ | H01L 43/02 |

OTHER PUBLICATIONS

U.S. Appl. No. 15/799,516, filed Oct. 31, 2017.
U.S. Appl. No. 15/828,101, filed Nov. 30, 2017.

* cited by examiner

*Primary Examiner* — David C Spalla
(74) *Attorney, Agent, or Firm* — McClure, Qualey & Rodack, LLP

(57) ABSTRACT

A method for fabricating an integrated circuit is provided. The method includes depositing a first polish stop layer above a memory device, in which the first polish stop layer has a first portion over the memory device and a second portion that is not over the memory device; removing the second portion of the first polish stop layer; depositing an inter-layer dielectric layer over the first polish stop layer after removing the second portion of the first polish stop layer; and polishing the inter-layer dielectric layer until reaching the first portion of the first polish stop layer.

20 Claims, 18 Drawing Sheets

INTEGRATED CIRCUIT AND FABRICATION METHOD THEREOF

BACKGROUND

Semiconductor memories are used in integrated circuits for electronic applications, including radios, televisions, cell phones, and personal computing devices, as examples. One type of semiconductor memory device involves spin electronics, which combines semiconductor technology and magnetic materials and devices. The spins of electrons, through their magnetic moments, rather than the charge of the electrons, are used to indicate a bit.

One such spin electronic device is magnetoresistive random access memory (MRAM) array, which includes conductive lines (word lines and bit lines) positioned in different directions, e.g., perpendicular to each other in different metal layers. The conductive lines sandwich a magnetic tunnel junction (MTJ), which functions as a magnetic memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
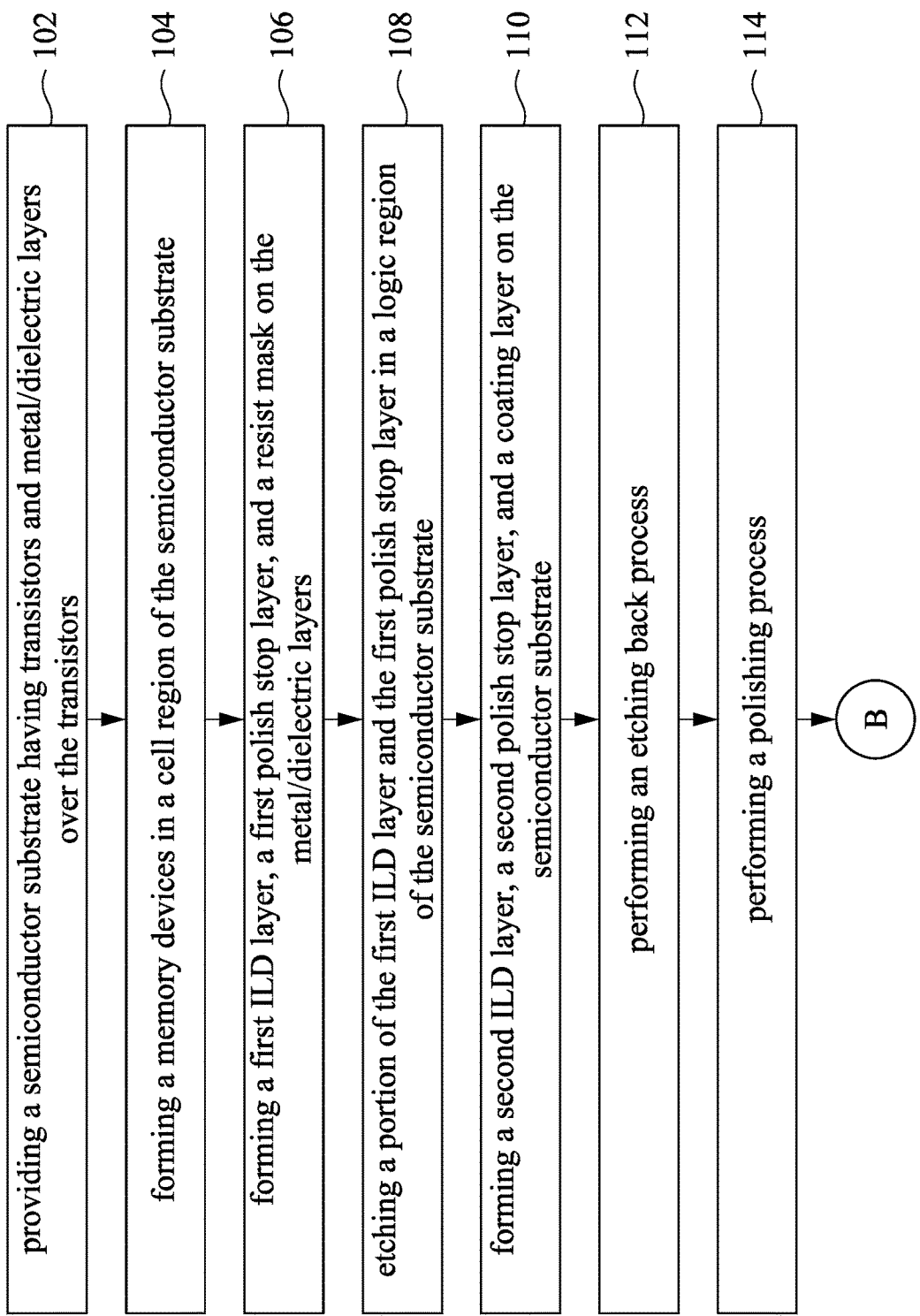
FIGS. 1A and 1B are flow charts of a method for forming an integrated circuit including MRAM devices and logic devices according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments of this disclosure, a magnetoresistive random access memory (MRAM) device is formed. The MRAM device includes a magnetic tunnel junction (MTJ) stack. The MTJ stack includes a tunnel barrier layer formed between a ferromagnetic pinned layer and a ferromagnetic free layer. The tunnel barrier layer is thin enough (such a few nanometers) to permit electrons to tunnel from one ferromagnetic layer to the other. A resistance of the MTJ stack is adjusted by changing a direction of a magnetic moment of the ferromagnetic free layer with respect to that of the ferromagnetic pinned layer. When the magnetic moment of the ferromagnetic free layer is parallel to that of the ferromagnetic pinned layer, the resistance of the MTJ stack is in a lower resistive state, corresponding to a digital signal "0". When the magnetic moment of the ferromagnetic free layer is anti-parallel to that of the ferromagnetic pinned layer, the resistance of the MTJ stack is in a higher resistive state, corresponding to a digital signal "1". The MTJ stack is coupled between top and bottom electrode and an electric current flowing through the MTJ stack (tunneling through the tunnel barrier layer) from one electrode to the other is detected to determine the resistance and the digital signal state of the MTJ stack.

According to some embodiments of this disclosure, the MRAM device is formed within a chip region of a substrate. A plurality of semiconductor chip regions is marked on the substrate by scribe lines between the chip regions. The substrate will go through a variety of cleaning, layering, patterning, etching and doping steps to form the MRAM devices. The term "substrate" herein generally refers to a bulk substrate on which various layers and device elements are formed. In some embodiments, the bulk substrate includes silicon or a compound semiconductor, such as GaAs, InP, SiGe, or SiC. Examples of the layers include dielectric layers, doped layers, polysilicon layers or conductive layers. Examples of the device elements include transistors, resistors, and/or capacitors, which may be interconnected through an interconnect layer to additional integrated circuits.

Figure 1B:
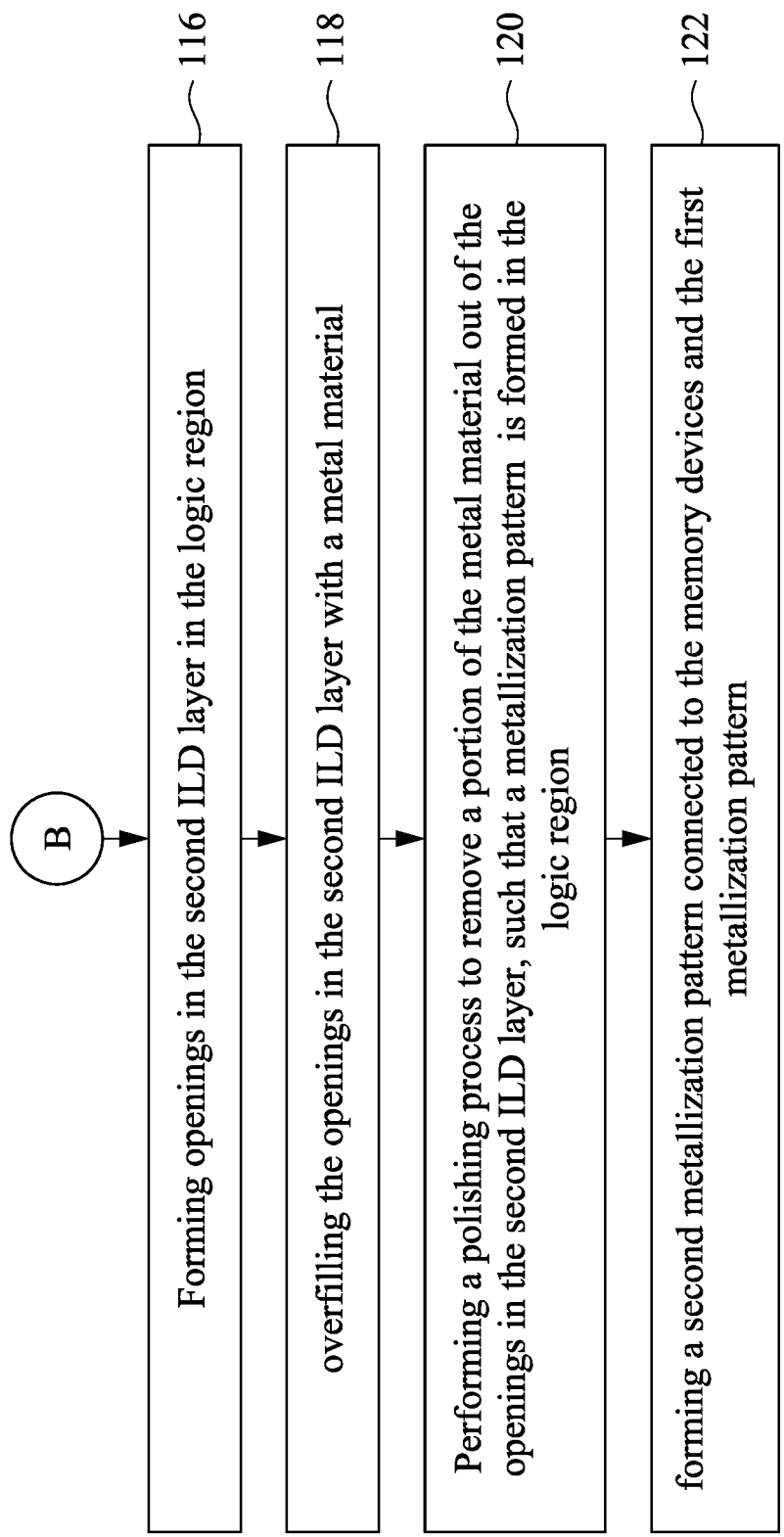

FIGS. 1A and 1B are flow charts of a method 100 for forming an integrated circuit including MRAM devices and logic devices according to some embodiments of the present disclosure. FIGS. 2A-2K are cross-sectional views at various intermediate stages of a method for forming an integrated circuit including MRAM devices and logic devices according to some embodiments of the present disclosure. The illustration is merely exemplary and is not intended to be limiting beyond what is specifically recited in the claims that follow. It is understood that additional operations may be provided before, during, and after the operations shown by FIGS. 1A and 1B, and some of the operations described below can be replaced or eliminated for additional embodiments of the method. The order of the operations/processes may be interchangeable.

Figure 2A:
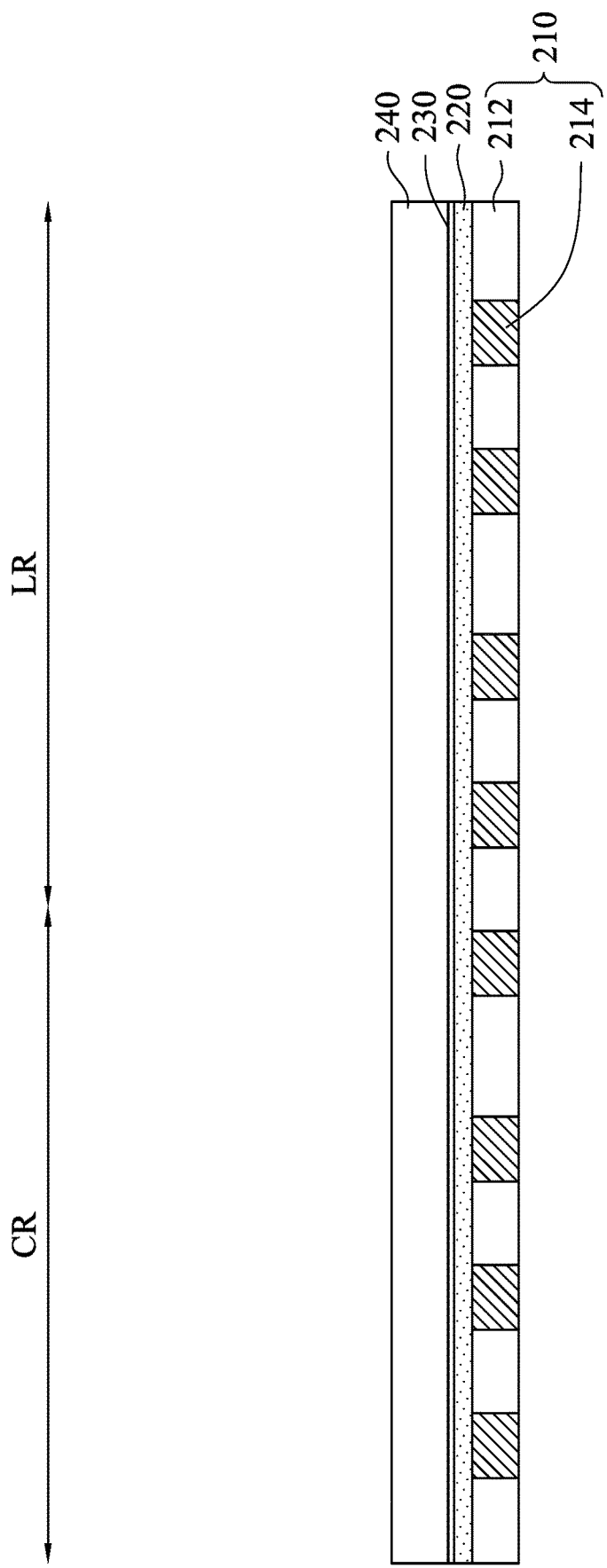
FIGS. 2A-2K are cross-sectional views at various intermediate stages of a method for forming an integrated circuit including MRAM devices and logic devices according to some embodiments of the present disclosure.

Referring to FIG. 1A and FIG. 2A, where the method 100 begins at step 102 where a semiconductor substrate having transistors and one or more metal/dielectric layers 210 over the transistors is provided. The semiconductor substrate has a cell region CR where MRAM devices are to be formed and a logic region LR where logic circuits are to be formed. The semiconductor substrate may be a silicon substrate. Alternatively, the substrate may comprise another elementary semiconductor, such as germanium; a compound semiconductor including silicon carbide; an alloy semiconductor including silicon germanium; or combinations thereof. In some embodiments, the substrate is a semiconductor on insulator (SOI) substrate. The substrate may include doped regions, such as p-wells and n-wells. In the present disclosure, a wafer is a workpiece that includes a semiconductor substrate and various features formed in and over and attached to the semiconductor substrate. The transistors are formed by suitable transistor fabrication processes and may be a planar transistor, such as polysilicon gate transistors or high-k metal gate transistors, or a multi-gate transistor, such as fin field effect transistors. After the transistors are formed, one or more metal/dielectric layers 210 of a multi-level interconnect (MLI) is formed over the transistors.

The metal/dielectric layer 210 includes an interlayer dielectric (ILD) layer or inter-metal dielectric (IMD) layer 212 with a metallization pattern 214 over the logic region LR and the cell region CR. The ILD layer 212 may be silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. The metallization pattern 214 may be aluminum, aluminum alloy, copper, copper alloy, titanium, titanium nitride, tantalum, tantalum nitride, tungsten, cobalt, the like, and/or combinations thereof.

In some embodiments, an etch stop layer 220, a protective layer 230, and a dielectric layer 240 are formed over the logic region LR and the cell region CR in a sequence. The etch stop layer 220 may have a high etch resistance to one or more subsequent etching processes. The etch stop layer 220 may be formed of dielectric material different from the underlying ILD layer 212. For example, the ILD layer 212 may be a silicon oxide layer, and the etch stop layer 220 may be a silicon nitride layer or a silicon carbide layer.

The protective layer 230 may be formed of dielectric material different from the etch stop layer 220 and the dielectric layer 240. In some embodiments, the protective layer 230 is an aluminum-based layer (Al-based layer). For example, the protective layer 230 is made from $AlO_x$, AlN, $AlN_yO_x$, other suitable material, or the combination thereof. In some other embodiments, the protective layer 230 may be a metal oxide layer containing other metals. By way of example, the protective layer 230 is a titanium oxide layer. In some embodiments, the protective layer 230 can be a single layer or a multi-layered structure.

The dielectric layer 240 in some embodiments is silicon carbide (SiC), silicon oxynitride (SiON), silicon nitride (SiN), silicon dioxide, the like, and/or combinations thereof. The dielectric layer 240 may be a single-layered structure or a multi-layered structure. The dielectric layer 240 may be formed by acceptable deposition techniques, such as chemical vapor deposition (CVD), atomic layer deposition (ALD), physical vapor deposition (PVD), the like, and/or a combination thereof.

Figure 2B:
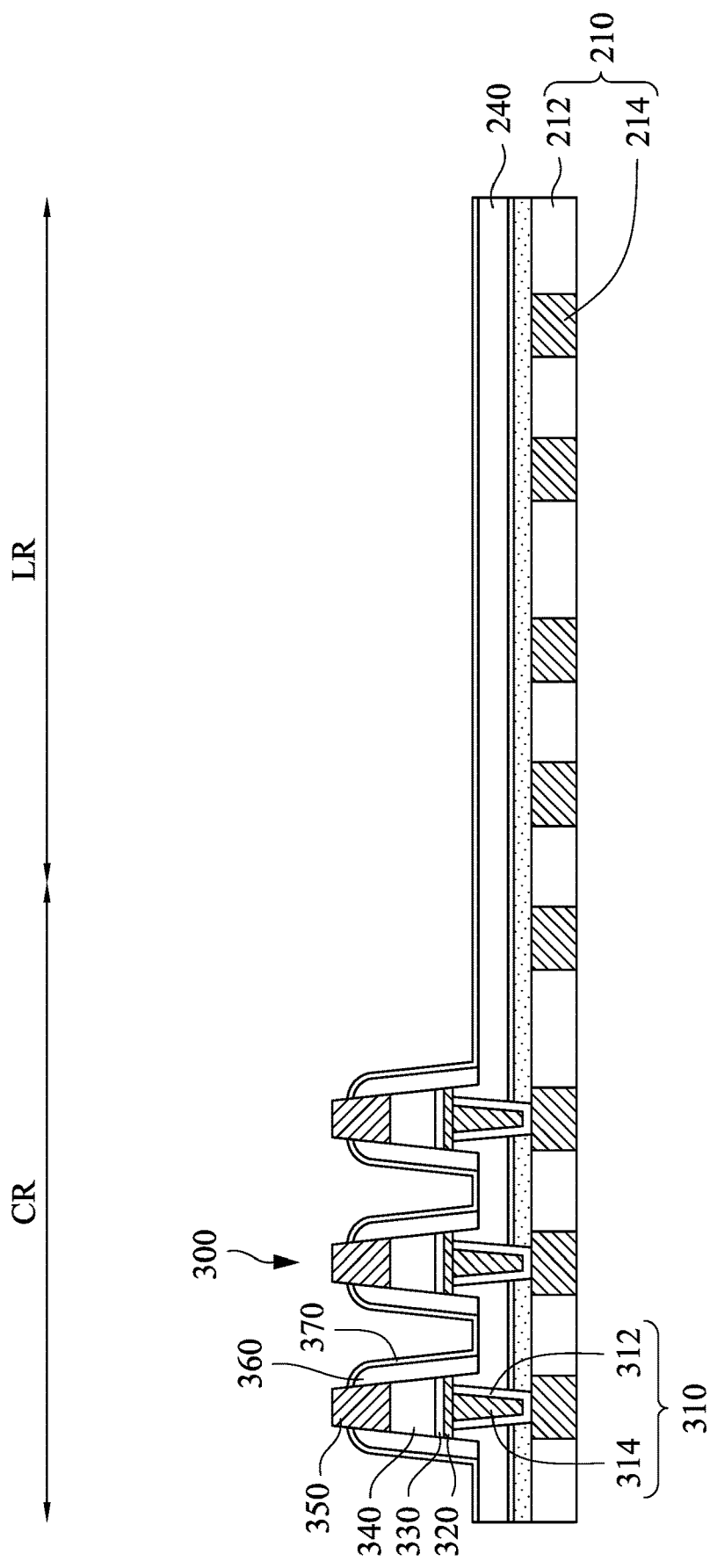

Reference is then made to FIG. 1A and FIG. 2B, where the method 100 proceeds to step 104 where MRAM devices 300 are formed over the cell region CR. Each of the MRAM devices 300 may include a bottom electrode via (BEVA) 310, a bottom electrode 320, a buffer 330, a resistance switching elements 340, and a top electrode 350.

In some embodiments, openings are formed in the dielectric layer 240 in the cell region CR and expose portions of the metallization pattern 214. An exemplary formation method of the openings includes forming a patterned mask may over the dielectric layer 240, and then etching the dielectric layer 240 through the patterned mask by one or more etching processes. BEVAs 310 are then formed within the openings O1. In some embodiments, at least one of the BEVAs 310 is a multi-layered structure and includes, for example, a diffusion barrier layer 312 and a filling metal 314 filling a recess in the diffusion barrier layer 312. An exemplary formation method of the BEVAs 310 includes forming in sequence the diffusion barrier layer 312 and the filling metal 314 into the openings, and performing a polishing process, such as a chemical-mechanical polishing (CMP) process, to remove excess materials of the filling metal 314 and of the diffusion barrier layer 312 outside the openings. The remaining diffusion barrier layer 312 and the remaining filling metal 314 in the openings can serve as the BEVAs 310. In some embodiments, the BEVAs 310 are electrically connected to an underlying electrical component, such as a transistor, through the metallization pattern 214.

In some embodiments, the diffusion barrier layer 312 is a titanium nitride (TiN) layer or a tantalum nitride (TaN) layer, which can act as a suitable barrier to prevent metal diffusion. Formation of the diffusion barrier layer 312 may be exemplarily performed using CVD, PVD, ALD, the like, and/or a combination thereof. In some embodiments, the filling metal 314 is titanium (Ti), tantalum (Ta), platinum (Pt), ruthenium (Ru), tungsten (W), aluminum (Al), copper (Cu), TiN, TaN, the like, and/or combinations thereof. Formation of the filling metal 314 may be exemplarily performed using CVD, PVD, ALD, the like, and/or a combination thereof.

Subsequently, the bottom electrode 320, the buffer 330, the resistance switching elements 340, and the top electrode 350 are formed over the BEVAs 310 and over the dielectric layer 240. For example, a blanket bottom electrode layer, a buffer layer, a resistance switching layer, and a top electrode layer are formed over the BEVAs 310 and over the dielectric layer 240 in a sequence, and then patterned into the bottom electrode 320, the buffer 330, the resistance switching elements 340, and the top electrode 350, respectively. Portions of the dielectric layer 240 may be etched away during the patterning process, such that recesses are formed in the dielectric layer 240 between the BEVAs 310.

The bottom electrode 320 can be a single-layered structure or a multi-layered structure. In some embodiments, the bottom electrode 320 includes a material the same as the filling metal 314 in some embodiments. In some other embodiments, the bottom electrode 320 includes a material different from the filling metal 314. In some embodiments, the bottom electrode 320 is titanium (Ti), tantalum (Ta), platinum (Pt), ruthenium (Ru), tungsten (W), aluminum (Al), copper (Cu), TiN, TaN, the like, and/or a combination thereof. Formation of the bottom electrode layer may be exemplarily performed using CVD, PVD, ALD, the like, and/or a combination thereof.

The buffer 330 may include a non-magnetic material. For example, the buffer 330 may include tantalum, aluminum, titanium, TiN, TaN, or the combination thereof. The buffer layer may be deposited by PVD, ALD, CVD, or MOCVD (metal-organic chemical vapor deposition). Alternatively, the buffer layer is deposited by an electroless plating process or other suitable process.

In some embodiments, the resistance switching element 340 may be a magnetic tunnel junction (MTJ) structure. To be specific, the resistance switching element 340 includes at least a first magnetic layer, a tunnel barrier layer and a second magnetic layer are formed in sequence over the bottom electrode 320 and the buffer 330.

In some embodiments, the first magnetic layer includes an anti-ferromagnetic material (AFM) layer over the buffer 330 and a ferromagnetic pinned layer over the AFM layer. In the anti-ferromagnetic material (AFM) layer, magnetic moments of atoms (or molecules) align in a regular pattern with magnetic moments of neighboring atoms (or molecules) in opposite directions. A net magnetic moment of the AFM layer is zero. In certain embodiments, the AFM layer includes platinum manganese (PtMn). In some embodiments, the AFM layer includes iridium manganese (IrMn), rhodium manganese (RhMn), iron manganese (FeMn), or OsMn. An exemplary formation method of the AFM layer includes sputtering, PVD, ALD, e-beam or thermal evaporation, or the like.

The ferromagnetic pinned layer in the first magnetic layer forms a permanent magnet and exhibits strong interactions with magnets. A direction of a magnetic moment of the ferromagnetic pinned layer can be pinned by an anti-ferromagnetic material (AFM) layer and is not changed during operation of a resulting resistance switching element 340 (e.g. a MTJ stack). In certain embodiments, the ferromagnetic pinned layer includes cobalt-iron-boron (CoFeB). In some embodiments, the ferromagnetic pinned layer includes CoFeTa, NiFe, Co, CoFe, CoPt, add CoFeB, CoFeBW, Co, Ru, or the alloy of Ni, Co and Fe. An exemplary formation method of the ferromagnetic pinned layer includes sputtering, PVD, ALD, e-beam or thermal evaporation, or the like. In some embodiments, the ferromagnetic pinned layer includes a multilayer structure.

The tunnel barrier layer is formed over the first magnetic layer. The tunnel barrier layer can also be referred to as a tunneling layer, which is thin enough that electrons are able to tunnel through the tunnel barrier layer when a biasing voltage is applied to a resulting resistance switching element 340 (e.g. a MTJ stack). In certain embodiments, the tunnel barrier layer includes magnesium oxide (MgO), aluminum oxide ($Al_2O_3$), aluminum nitride (AlN), aluminum oxynitride (AlON), hafnium oxide ($HfO_2$) or zirconium oxide ($ZrO_2$). An exemplary formation method of the tunnel barrier layer includes sputtering, PVD, ALD, e-beam or thermal evaporation, or the like.

The second magnetic layer is formed over the tunnel barrier layer. The second magnetic layer is a ferromagnetic free layer in some embodiments. A direction of a magnetic moment of the second magnetic layer is not pinned because there is no anti-ferromagnetic material in the second magnetic layer. Therefore, the magnetic orientation of this layer is adjustable, thus the layer is referred to as a free layer. In some embodiments, the direction of the magnetic moment of the second magnetic layer is free to rotate parallel or anti-parallel to the pinned direction of the magnetic moment of the ferromagnetic pinned layer in the first magnetic layer. The second magnetic layer may include a ferromagnetic material similar to the material in the ferromagnetic pinned layer in the first magnetic layer. Since the second magnetic layer has no anti-ferromagnetic material while the first magnetic layer has an anti-ferromagnetic material therein, the first and second magnetic layers and have different materials. In certain embodiments, the second magnetic layer includes cobalt, nickel, iron, boron, or their alloy. An exemplary formation method of the second magnetic layer includes sputtering, PVD, ALD, e-beam or thermal evaporation, or the like.

In some embodiments where resistive random access memory (RRAM) cells are to be formed on the wafer, the resistance switching element 340 may include a RRAM dielectric layer such as metal oxide composite, such as hafnium oxide ($HfO_x$), zirconium oxide ($ZrO_x$), aluminum oxide ($AlO_x$), nickel oxide ($NiO_x$) tantalum oxide ($TaO_x$), or titanium oxide ($TiO_x$) as in its relative high resistance state and a metal such as titanium (Ti), hafnium (Hf), platinum (Pt), ruthenium (Ru), and/or aluminum (Al) as in its relative low resistance state.

The top electrode 350 includes a conductive material. In some embodiments, the top electrode 350 is similar to the bottom electrode 320 in terms of composition. In some embodiments, the top electrode 350 includes titanium (Ti), tantalum (Ta), platinum (Pt), ruthenium (Ru), tungsten (W), aluminum (Al), copper (Cu), TiN, TaN, the like or combinations thereof. An exemplary formation method of the top electrode layer includes sputtering, PVD, ALD, e-beam or thermal evaporation, or the like.

In some embodiments, the MRAM device 300 may further include spacers 360 and 370 over sidewalls of the resistance switching elements 340. Material of the spacers 360 and 370 may be selected to protect the resistance switching elements 340 without influencing the function of the resistance switching elements 340. In some embodiments, a density of the spacer 370 is greater than a density of the spacer 360, so as to provide strong protection to the resistance switching elements 340. In some embodiments, the spacers 360 may separate the resistance switching elements 340 from the spacer 370. Since the resistance switching elements 340 is encapsulated by the spacers 360, it is less likely that the spacer 370 influences the function of the resistance switching elements 340, and therefore the spacer 370 may include a wider range of material than that of the spacer 360.

For example, the spacers 360 and 370 may include suitable dielectric materials such as silicon nitride, silicon carbide, carbon-doped silicon nitride, carbon-doped silicon oxide, silicon oxynitride, other suitable materials, and combinations thereof. The spacer 370 may be made of the same material as that of the spacer 360. For example, in some embodiments where the spacer 360 and the spacer 370 are made of the same material, the spacer 360 is formed at a first temperature, and the spacer 370 is formed at a second temperature higher than the first temperature, such that a density of the spacer 370 is greater than a density of the spacer 360.

In some embodiments, at least one of the spacers 360 and 370 may also be a composite layer including two or more layers made of different materials, such as a silicon nitride/silicon carbide stack. In some embodiments, the spacers 360 may be formed by forming a spacer layer and patterning the spacer layer to expose the top electrode 350 and a portion of the dielectric layer 240. The spacer layer may be formed using CVD, PVD, ALD, the like, and/or combinations. The patterning process may be dry etching, wet etching, or a combination thereof. In some embodiments where the spacer layer is silicon nitride, the patterning of the silicon nitride layer includes a dry etching using $CH_2F_2$, $CF_4$, $CH_xF_y$, $CHF_3$, $CH_4$, $N_2$, $O_2$, Ar, He, as an etchant, although other applicable etchants may be used. In some other embodiments, the dielectric layer 240 may have a higher etch resistance to the etching process than that of the spacer 360, such that the etching process may stop at the top surface of the dielectric layer 240.

In some embodiments, the spacers 370 may be formed by forming a spacer layer and optionally patterning the spacer layer to expose the top electrode 350. The formation and patterning of the spacer layer may be similar to aforementioned, and not repeated herein. In some embodiments, an etching process in patterning the spacer layer may be performed to remove a portion of the spacer layer above the top electrode 350 and optionally stopped before reaching the dielectric layer 240, and therefore a thin film of the spacer 370 leaves over a top surface of the dielectric layer 240. For example, the spacer 370 has a thin film over the top surface of the dielectric layer 240 in the logic region LR. In some other embodiments, the dielectric layer 240 may have a higher etch resistance to the etching process than that of the spacer 370, the etching process may stop at the top surface of the dielectric layer 240, and leaves no thin film of the spacers 370 over the top surface of the dielectric layer 240.

In some embodiments, the MRAM device 300 may further include a capping layer between the resistance switching layer 340 and the top electrode 350. The capping layer may include a thin metal-oxide or metal-nitride layer. The metal in the metal-oxide (or metal-nitride) capping layer includes beryllium (Be), magnesium (Mg), aluminium (Al), titanium (Ti), tungsten (W), germanium (Ge), platinum (Pt) and their alloy. The capping layer may be deposited by PVD, ALD, e-beam or thermal evaporation, or the like.

Figure 2C:
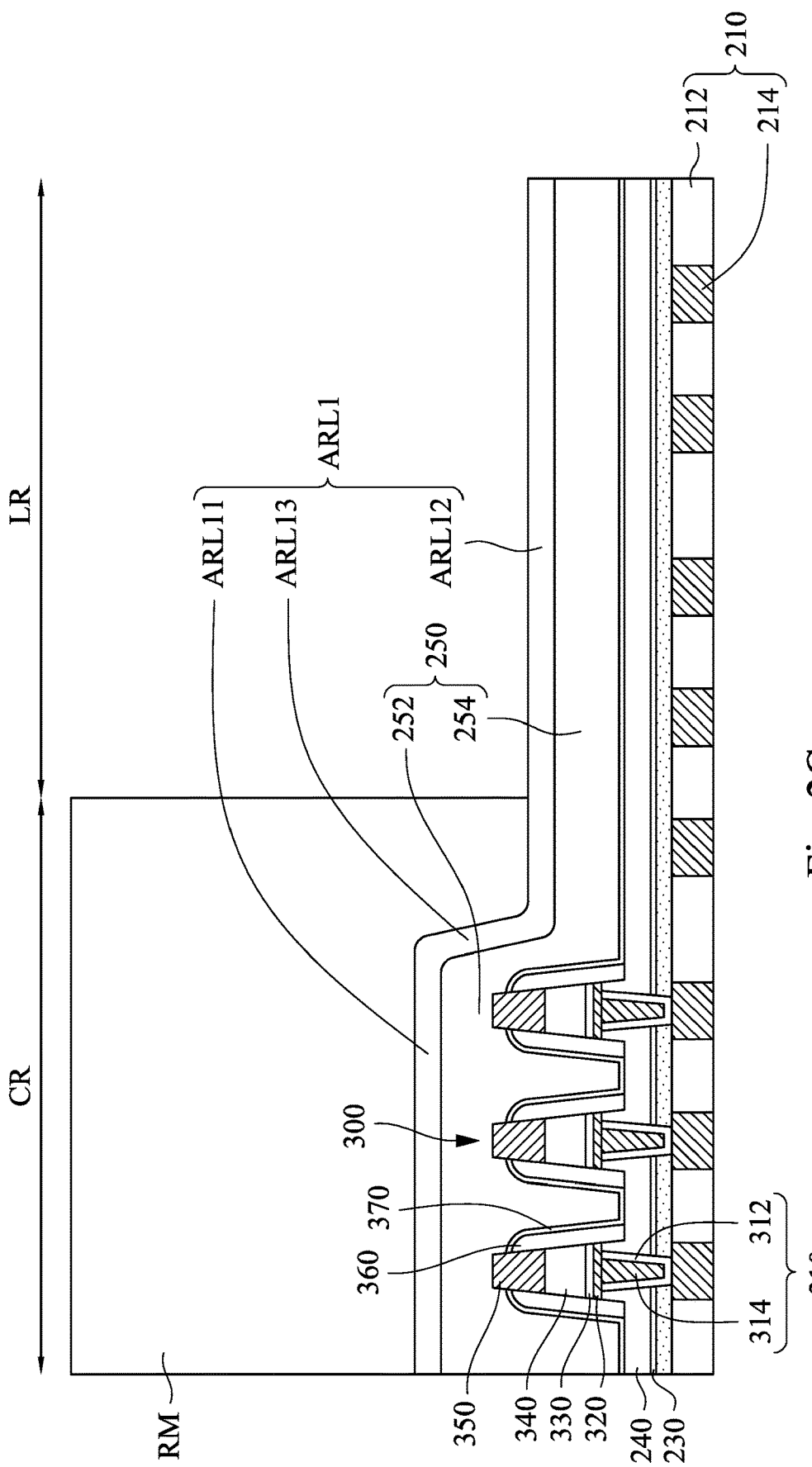

Reference is then made to FIG. 1A and FIG. 2C, where the method 100 proceeds to step 106 where an ILD layer 250, a polish stop layer ARL1, and a resist mask RM are formed over the structure of FIG. 2B in a sequence. In some embodiments, the ILD layer 250 may have the same material as the ILD layer 212. In some other embodiments, the ILD layer 250 may have a different material than the ILD layer 212. In some embodiments, the ILD layer 250 includes silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. In some embodiments, the ILD layer 250 is formed by a suitable technique, such as CVD. The ILD layer 250 may be conformally formed. Due to the presence of the MRAM devices 300, the ILD layer 250 has a portion 252 over and surrounding the MRAM devices 300 and a portion 254 not over the MRAM devices 300, in which the portion 252 higher than the portion 254.

The polish stop layer ARL1 is formed over the ILD layer 250. In some embodiments, the polish stop layer ARL1 is an anti-reflection layer, such as a nitrogen-free anti-reflection layer (NFARL). The polish stop layer ARL1 may be composed of SiOC, for example. The polish stop layer ARL1 may be formed by PECVD using reactant gases such as $SiH_4$ and $CO_2$ to a thickness of between about 50 and 500 Angstroms, for example. Since the precursor gases do not include nitrogen or nitrogen compounds such as ammonia ($NH_3$), the polish stop layer ARL1 is substantially free of nitrogen. In some other embodiments, the polish stop layer ARL1 may be made of SiCN or other suitable material. In the present embodiments, the polish stop layer ARL1 may has portions ARL11, ARL12, and ARL13. The portion ARL11 is over the portion 252 of the ILD layer 250, the portion ARL12 is over the portion 254 of the ILD layer 250, and the portion ARL13 connects the portion ARL11 to the portion ARL12. In some embodiments where the polish stop layer ARL1 is conformally formed, due to the presence of the MRAM devices 300, the portion ARL11 is higher than the portion ARL12.

Herein, the resist mask RM is formed over the ILD layer 250 and the polish stop layer ARL1. The resist mask RM is forming by patterning a resist layer (e.g., a photoresist layer) using a suitable photolithography process. The resist mask RM covers the memory region CR and exposes the logic region LR. For example, the resist mask RM covers the portions ARL11 and ARL13 and a part of the portion ARL12 in the cell region CR, but exposes another part of the portion ARL12 in the logic region LR.

Figure 2D:
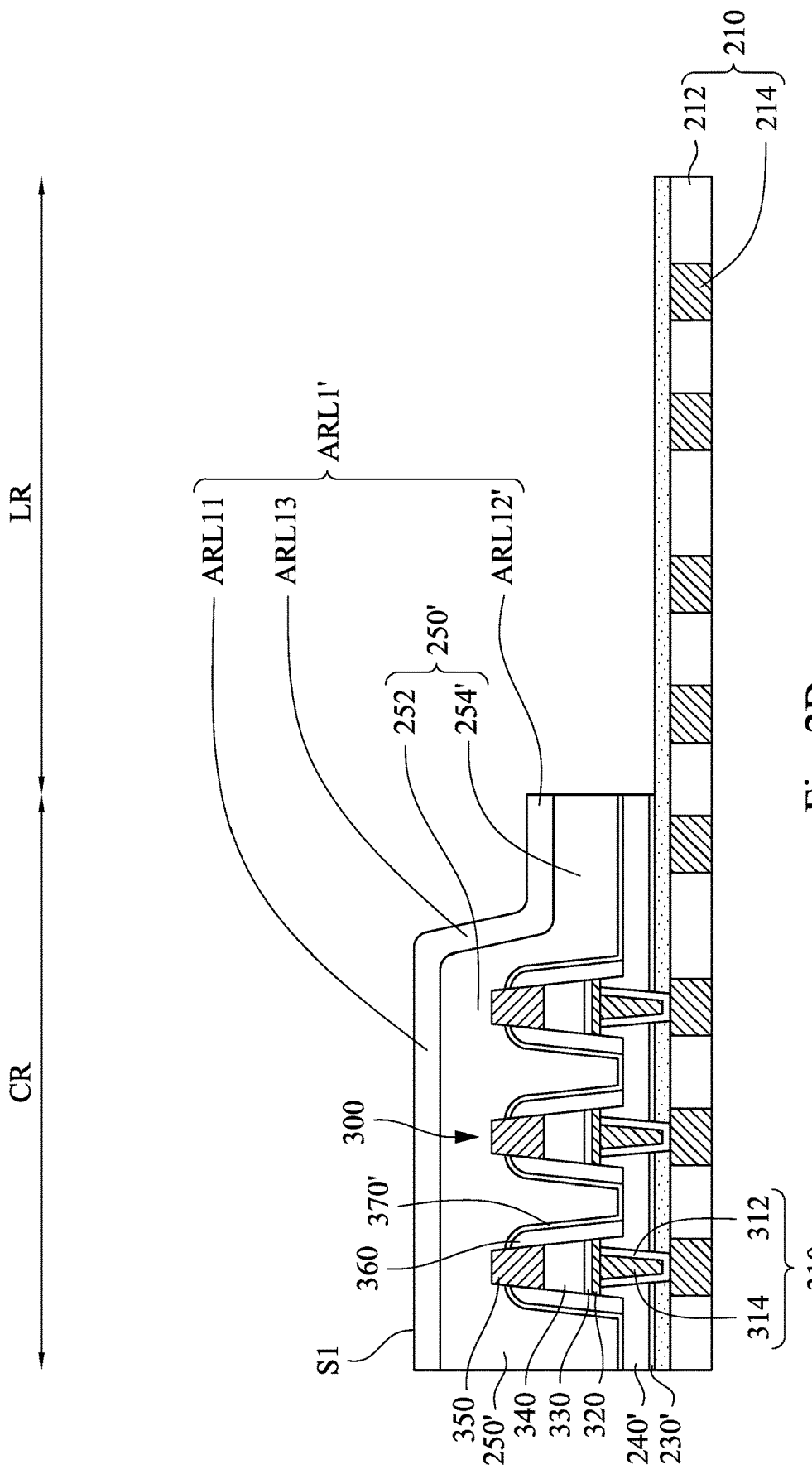

Reference is then made to FIG. 1A and FIG. 2D, where the method 100 proceeds to step 108 where portions of the polish stop layer ARL1, the ILD layer 250, the spacer 370, the dielectric layer 240, and the protective layer 230 (referring to FIG. 2C) in the logic region LR are removed. The removal may be performed by one or more etching processes. The resist mask RM (referring to FIG. 2C) acts as an etching mask during the etching processes, and the elements in the memory region CR are protected from being etched by the resist layer RM. After the etching processes, the remaining portions of the layers ARL1, 250, 370, 240, and 230 are respectively referred to as the polish stop layer ARL1', the ILD layer 250', the spacer 370', the dielectric layer 240', and the protective layer 230', which are in the cell region CR and not in the logic region LR. For example, the portion ARL12 of the polish stop layer ARL1 (referring to FIG. 2C) is partially removed, and the remaining part of the portion ARL12 is referred to as the portion ARL12' in the cell region CR. The portion 254 of the ILD layer 250 (referring to FIG. 2C) is partially removed, and the remaining part of the portion 254 is referred to as the portion 254' in the cell region CR.

In some embodiments, the removal may be performed by first and second etching processes. In some embodiments, the etchant used in first etching process can be dilute hydrofluoric acid (HF), HF vapor, $CF_4$, $C4F_8$, $CH_xF_y$, $C_xF_y$, $SF_6$, $N_2$, $O_2$, Ar, He, or $NF_3$ gas, their combination, or other suitable gas. In some embodiments, the protective layer 230 (referring to FIG. 2C) has a higher etch resistance to the first etching process than that of the ILD layer 250 and the dielectric layer 240 (referring to FIG. 2C). For example, in an first etching process using dilute HF, HF vapor, $CF_4$, $C_4F_8$, $CH_xF_y$, $C_xF_y$, $SF_6$, $N_2$, $O_2$, Ar, He, or $NF_3$ gas, their combination or other suitable gas as an etchant, an etch rate of the protective layer 230 (referring to FIG. 2C) is slower than that of at least one of the ILD layer 250 and the dielectric layer 240 (referring to FIG. 2C). Through the configuration, the first etching process in the logic region LR stops at the protective layer 230 (referring to FIG. 2C), and the etch stop layer 220 is protected by the protective layer 230 (referring to FIG. 2C) during the first etching process. In some embodiments, the protective layer 230 (referring to FIG. 2C) may have a higher etch resistance to the first etching process than that of the etch stop layer 220.

Subsequently, a portion of the protective layer 230 (referring to FIG. 2C) in the logic region LR is removed by a second etching process, such as dry etching, atomic layer etching (ALE), wet etching, or the combination thereof. The etch stop layer 220 has a higher etch resistance to the second etching process than that of the protective layer 230 (referring to FIG. 2C), such that the etching process stops at the etch stop layer 220. After the removal, the protective layer 230' is not in the logic region LR. In the present embodiments, the resist layer RM is resistant to the first and second etching processes. For example, the resist layer RM has a higher etch resistance to the first etching process than that of the ILD layer 250 and the dielectric layer 240 (referring to FIG. 2C), and the resist layer RM has a higher etch resistance to the first etching process than that of the protective layer 230 (referring to FIG. 2C). After the first and second etching processes, the resist layer RM is removed by suitable etching processes.

Figure 2E:
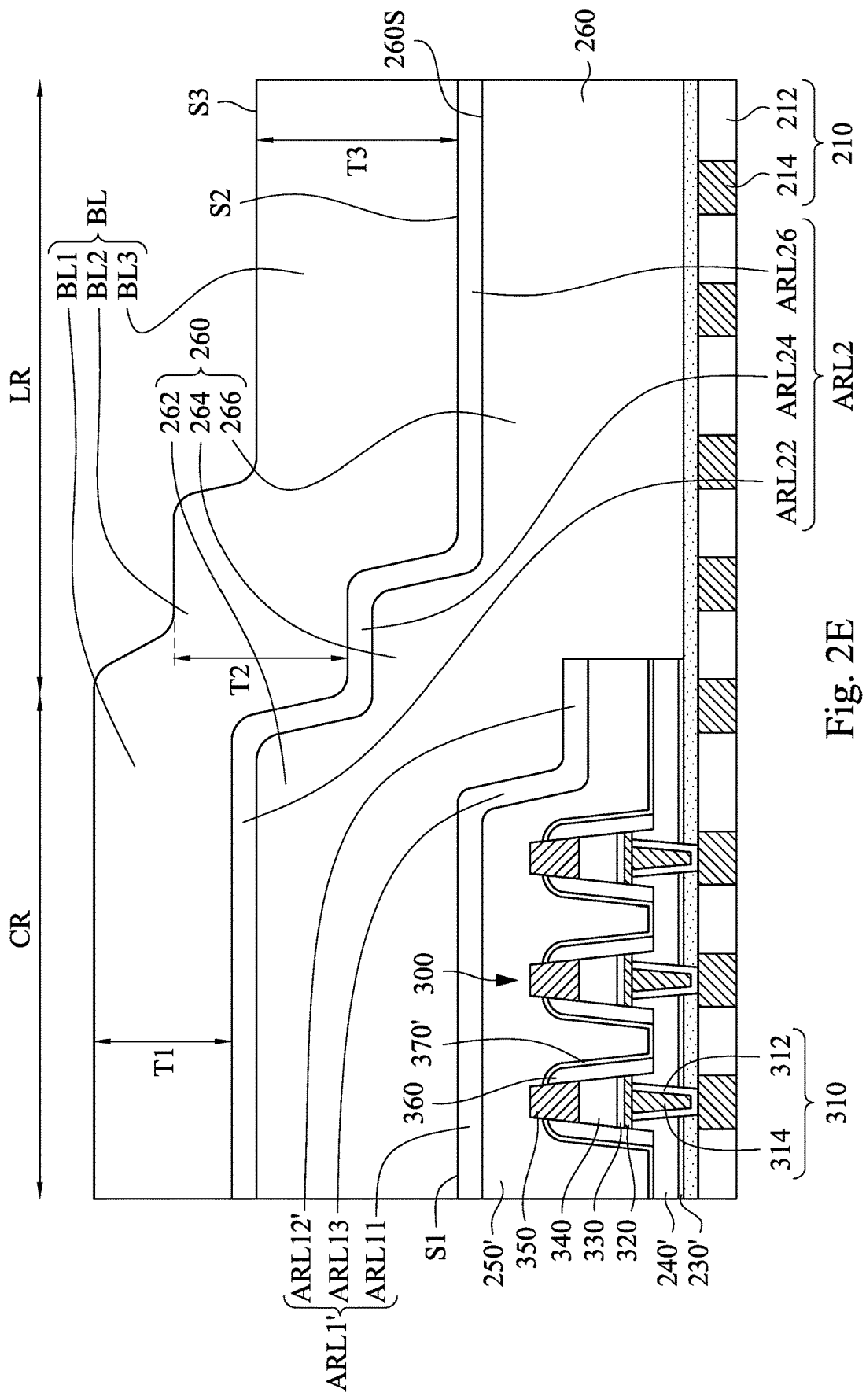

Reference is then made to FIG. 1A and FIG. 2E, where the method 100 proceeds to step 110 where an ILD layer 260, a polish stop layer ARL2, and a coating layer BL are formed over the structure of FIG. 2D. In some embodiments, the ILD layer 260 has a portion 262 over the portion ARL11, a portion 264 over the portion ARL12', and a portion 266 over the logic region LR. In some embodiments, the ILD layer 260 is conformally formed and have a suitable thickness to provide a surface 260S at suitable level for the deposition of the polish stop layer ARL2. For example, the portions 262-266 have the same or similar thicknesses, which may be in a range of about 1 micrometer to about 3 micrometers. For example, the thickness of the portions 262-266 is about 1.2 micrometers. Due to the height difference between the cell region CR and the logic region LR, in some embodiments, the top surfaces of the portions 262-266 get lower in a sequence.

In some embodiments, the ILD layer 260 may have the same material as the ILD layer 212 or the ILD layer 250. In some other embodiments, the ILD layer 260 may have a different material than the ILD layers 212 and 250. For example, the ILD layer 260 includes silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. In some embodiments, the ILD layer 260 is formed by a suitable technique, such as CVD.

The polish stop layer ARL2 is formed over the surface 260S of the ILD layer 260. In some embodiments, the polish stop layer ARL2 is substantially a nitrogen-free anti-reflection layer (NFARL). The polish stop layer ARL2 may be composed of SiOC, for example. The polish stop layer ARL2 may be formed by PECVD using reactant gases such as $SiH_4$ and $CO_2$ to a thickness of between about 50 and 500 Angstroms, for example. Since the precursor gases do not include nitrogen or nitrogen compounds such as ammonia ($NH_3$), the polish stop layer ARL2 is free of nitrogen. In some other embodiments, the polish stop layer ARL2 may be made of SiCN or other suitable material. The material of the polish stop layer ARL2 may be the same as that of the polish stop layer ARL1. The polish stop layer ARL2 has a portion ARL22 over the portion 262 of the ILD layer 260, a portion ARL24 over the portion 264 of the ILD layer 260, and a portion ARL26 over the portion 266 of the ILD layer 260. In some embodiments, the portions ARL22-ARL26 have similar thicknesses. For example, the thickness of the portions ARL22-ARL26 may be in a range of about 10 nanometers to about 50 nanometers. For example, the thickness of the portions ARL22-ARL26 is about 30 nanometers. In some embodiments, the top surfaces of the portions ARL22-ARL26 get lower in a sequence, such that the polish stop layer ARL2 has an uneven top surface S2.

In some embodiments, thicknesses of the ILD layer 260 and the polish stop layer ARL2 are designed such that the portion ARL26 of the polish stop layer ARL2 may be horizontally aligned with respect to the portion ARL11 of the polish stop layer ARL1. For example, the thickness of the ILD layer 260 is designed to be similar to that of a combination of thicknesses of the ILD layer 250', the spacer 370', the dielectric layer 240', and the protective layer 230', such that the portion ARL26 is at a position level with that of the portion ARL11. In some embodiments, the thickness of the polish stop layer ARL2 may further be designed to be similar to that of the polish stop layer ARL1', such that a top surface of the portion ARL26 is coplanar with a top surface of the portion ARL11. However, it should not limit the scope of the present disclosure. In some other embodiments, the top surface of the portion ARL26 may be not coplanar with the top surface of the portion ARL11, but the portion ARL26 may be horizontally overlapped with the portion ARL11. For example, a part of the portion ARL26 is at a position level with that of a part of the portion ARL11. In some other embodiments, the thickness of the ILD layer 260 may be different from that of a combination of the ILD layer 250', the spacer 370', the dielectric layer 240', and the protective layer 230'. In some other embodiments, the thickness of the polish stop layer ARL2 may be different from that of the polish stop layer ARL1'.

In the present embodiments, the coating layer BL is formed on the polish stop layer ARL2 using a coating process (e.g., a spin coating process). Such a coating process may be advantageous to form a non-conformal layer over the uneven surface S2 of the polish stop layer ARL2, and hence the coating layer BL may be non-conformally formed over the uneven top surface S2. Such a non-conformal formation of the coating layer BL makes top and bottom surfaces of the coating layer BL have different geometries. As such, in some embodiments where the bottom surface of the coating layer BL is conformal to the uneven top surface S2 of the polish stop layer ARL2, the non-conformal formation may be advantageous to form the top surface of the coating layer BL with less curvature than that of the uneven top surface S2 of the polish stop layer ARL2. Therefore, the coating layer BL can have a top surface S3 that is more planar than the top surface S2 of the polish stop layer ARL2. In other words, herein, the coating layer BL has portions BL1, BL2, and BL3 respectively over the portions ARL22, ARL24, and ARL26, and a thickness T3 of the portion BL3 of the coating layer BL is greater than a thickness T2 of the portion BL2 of the coating layer BL, and a thickness T2 of the portion BL2 of the coating layer BL is greater than a thickness T1 of the portion BL1 of the coating layer BL.

In some embodiments of the present disclosure, a flowable material can be spin-coated over the polish stop layer ARL2. The flowable material includes a material of the coating layer BL such as a bottom layer of photoresist. In some embodiments, the spin-coating process may include multi-steps with different spin speeds in each step to achieve a desired profile for the top surface S3 of the coating layer BL. After the spin coating process, the flowable material can be cured. Curing the flowable material hardens the coating layer BL. In some embodiments, curing the flowable material comprises exposing the flowable material to an elevated temperature. In some embodiments, the spin coating process and the curing process may be performed in separate processing chambers (i.e. performed ex-situ). In other embodiments, the spin coating process and the curing process may be performed in-situ.

Figure 2F:
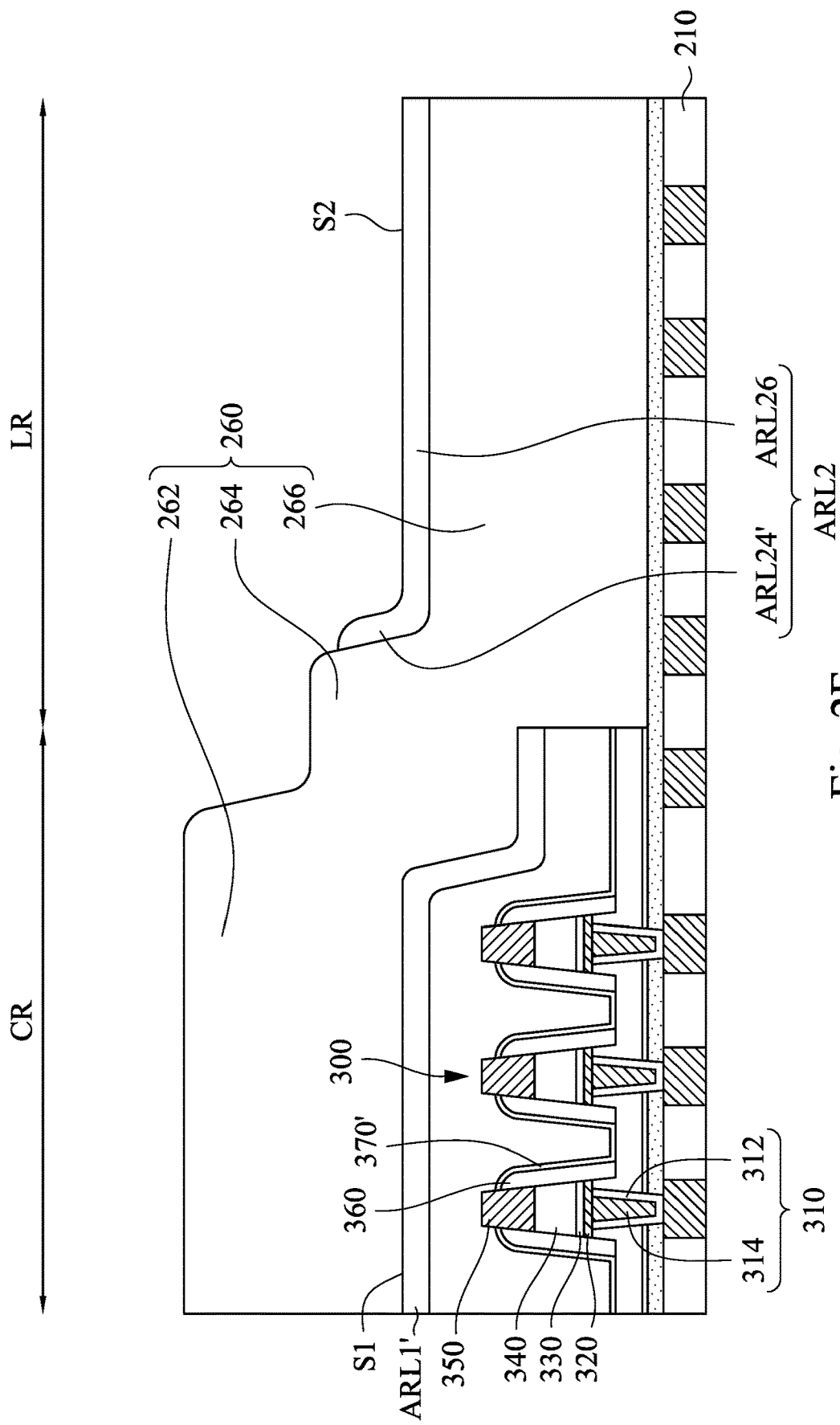

Reference is then made to FIG. 1A and FIG. 2F, where the method 100 proceeds to step 112 where an etching back process is performed until reaching the ILD layer 260. In some embodiments, it is designed that the portion BL3 of the coating layer BL (referring to FIG. 2E) has a resistance to the etching back process similar to that of a combination of the portion ARL22 of the polish stop layer ARL2 and the portion BL1 of the coating layer BL (referring to FIG. 2E). For example, a rate of etching the coating layer BL may be substantially equal to a rate of etching the polish stop layer ARL2, and a combination of the thickness T1 of the portion BL1 and a thickness of the portion ARL22 is substantially equal to the thickness T3 of the portion BL3. Through the configuration, while the portion ARL22 over the cell region CR is removed by the etching back process, the portion ARL 26 remains over the logic region LR.

In some embodiments, the portion BL2 of the coating layer BL and a main part of the portion ARL24 of the polish stop layer ARL2 (referring to FIG. 2E) are also removed by the etching back process, and a residue of the portion ARL24 may remain and be referred to as the portion ARL24' hereinafter. The portion ARL24' is on a side of the portion 264.

In some other embodiments, portions 262 and 264 of the ILD layer 260 in the cell region CR may be slightly etched, while a portion 266 of the ILD layer 260 in the logic region LR remains by the protection of the portion ARL26. Herein, the etching back process may be a dry etch using an etchant, such as $CH_xF_y$, $CF_4$, He, $O_2$, $N_2$, Ar, $NF_3$, $SF_6$, their combination, or other suitable etching gas.

Figure 2G:
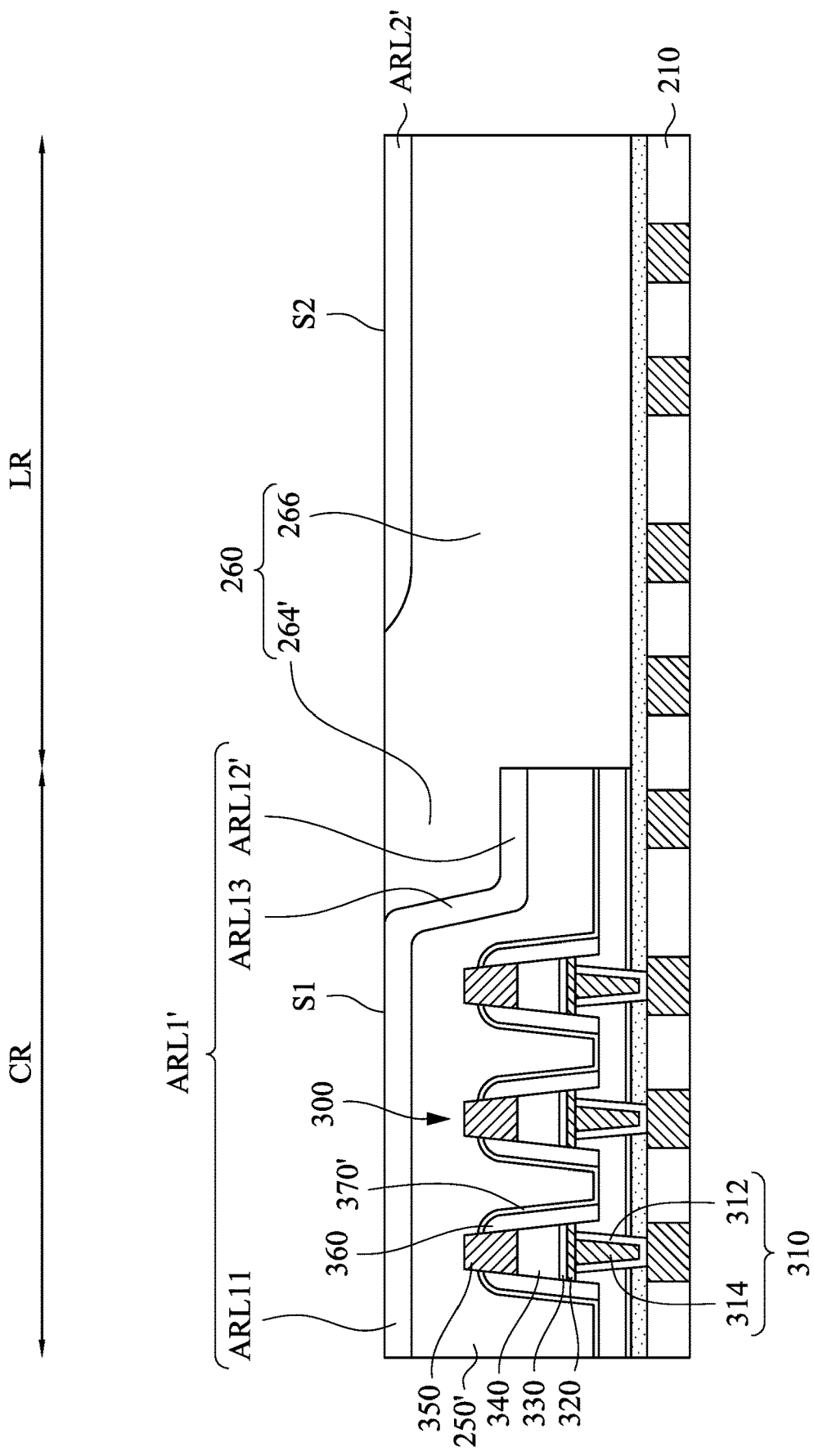

Reference is then made to FIG. 1A and FIG. 2G, where the method 100 proceeds to step 114 where a polishing process is performed. The polishing process may include a chemical-mechanical polishing (CMP) process, which is also referred to as a chemical-mechanical polishing process.

CMP is a process that utilizes the reagent within slurry to react chemically with the front face of the wafer, and produce an easily polished layer. Herein, the front face of the wafer reacting with the slurry is the surface of the ILD layer 260 (referring to FIG. 2F). Such slurry may contain some active polishing ingredients such as abrasive particles. The abrasive particles are made of aluminum oxide, silicon oxide or cerium oxide, for example. Together with the abrasive action provided by the abrasive particles in the slurry under a polishing pad, the portion 262 of the ILD layer 260 (referring to FIG. 2F) is gradually removed. By repeating the foregoing chemical reaction and mechanical polishing steps, the front surface of the wafer is planarized. A number of variables can affect the CMP process. These include the pressure applied to the polishing head, the planarity of the wafer, the rotational speed of the wafer and the polishing pad, the chemical composition of the slurry and the abrasive particles, the operating temperature, the material and abrasive properties of the polishing pad, and so on. After the CMP process, de-ionized water may be used to clear away residue from the CMP process, such as the slurry and abrasive particles on the wafer.

Herein, a high-selectivity slurry (HSS) may be used in the polishing process so that the determination of the polishing end point is made clearer. That is, the polish stop layer ARL1' and/or ARL2 may have a property relate to the polishing different from that of the ILD layer 260 (referring to FIG. 2F), such that the polish stop layer ARL1' and/or ARL2 (referring to FIG. 2F) may function as a CMP stop layer in the polishing process. In some embodiments, the polish stop layer ARL1' and/or ARL2 may have a higher resistance to the polishing than that of the ILD layer 260 (referring to FIG. 2F). That is to say, in some embodiments, the polish stop layer ARL1' and/or ARL2 may be configured to have a greater hardness or a higher resistance to acidic solutions in the slurry than that of the ILD layer 260 (referring to FIG. 2F). Therefore, the polishing rate of the polish stop layer ARL1' and/or ARL2 is relatively slow compared to the rate of the ILD layer 260 (referring to FIG. 2F). For example, a polish rate to the ILD layer 260 (e.g., oxides) is higher than that to the polish stop layers ARL1' and ARL2 (e.g., SiOC, SiCN, SiN, or SiON). In this way, the CMP process is performed until reaching the polish stop layer ARL1' and/or ARL2.

Through the configuration, while the portion 262 of the ILD layer 260 (referring to FIG. 2F) is removed, the polishing process may stop at top surfaces S1 and S2 of the polish stop layers ARL1' and ARL2 (referring to FIG. 2F), and the underlying ILD layers 250' and 260 remains. The polishing process may also remove a part of the portion 264 of the ILD layer 260 (referring to FIG. 2F), and a remaining part of the portion 264 is referred to as portion 264' hereinafter, and the portion 264' has a top surface flush with the surface S1. The polishing process may also remove the portion ARL24' (referring to FIG. 2F), and leaves the portion ARL26 (referring to FIG. 2F), which is referred to as the polish stop layer ARL2' hereinafter. After the polishing process, the ILD layer 260, the portion ARL11, and the polish stop layer ARL2' are exposed and commonly have a flat top surface, and the portions ARL12' and ARL13 of the polish stop layer ARL1' are covered by the portion 264' of the ILD layer 260.

Figure 2H:
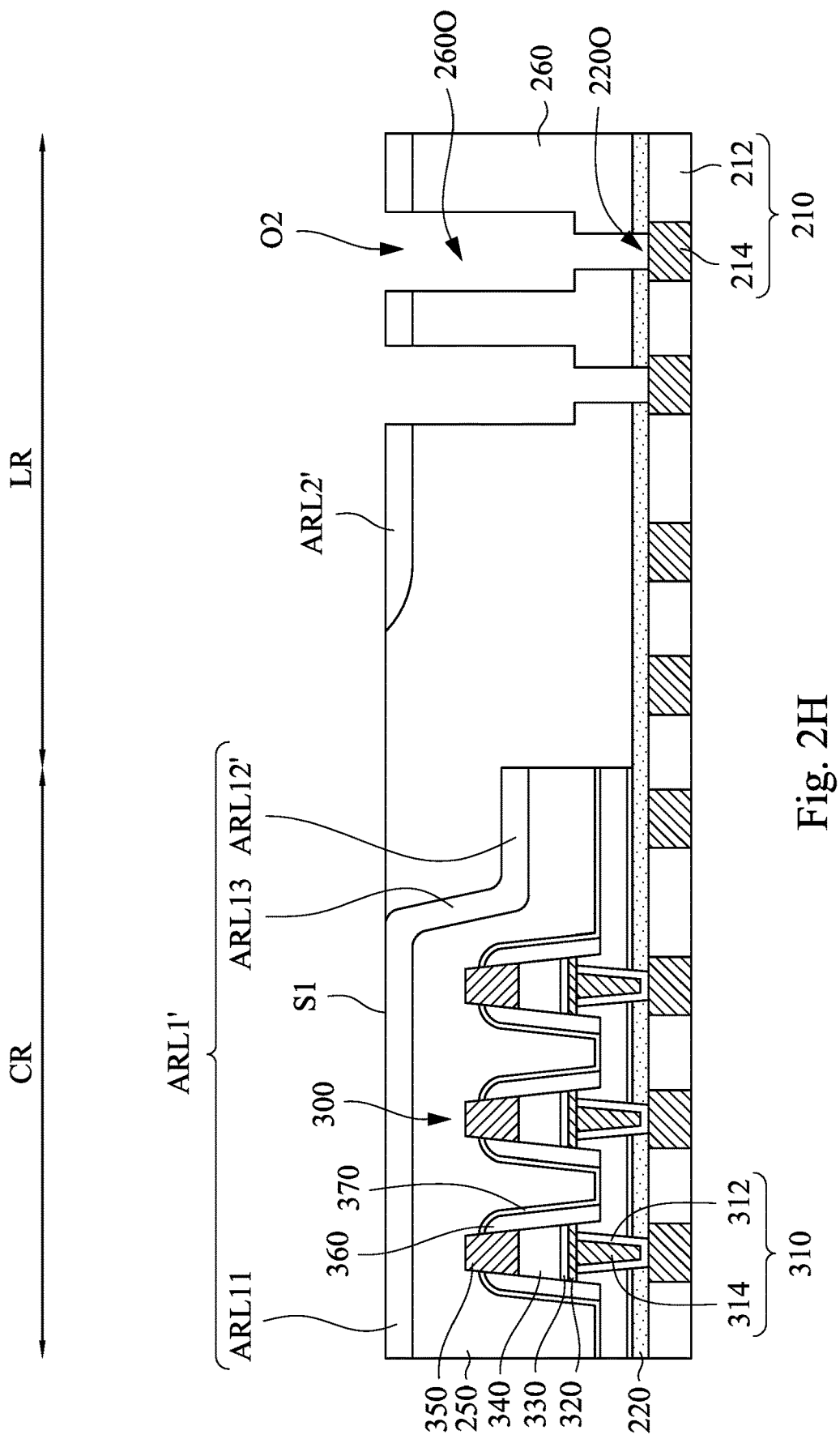

Reference is then made to FIG. 1B and FIG. 2H, where the method 100 proceeds to step 116 where openings O2, openings 260O, and openings 220O are formed in the polish stop layer ARL2', the ILD layer 260, and the etch stop layer 220, respectively. The holes or openings O2, 260O, 220O are in communication with each other and expose the top surface of the metallization pattern 214 in the logic region LR. In some embodiments, the openings O2 and openings 260O are etched in polish stop layer ARL2' and the ILD layer 260 by a first etching process, and the openings 220O are etched in the etch stop layer 220 by a second etching process. The etch stop layer 220 has a higher etch resistance to the first etching process than that of the ILD layer 260, such that the first etching process stops at the etch stop layer 220 and not damage the underlying metal/dielectric layers 210. In some embodiments where the ILD layer 260 is silicon oxide, the etchant used in the first etching process can be dilute hydrofluoric acid (HF), HF vapor, $CF_4$, $C4F_8$, $CH_xF_y$, $C_xF_y$, $SF_6$, $NF_3$, Ar, $N_2$, $O_2$, He, or other suitable gas. In some embodiments, the metallization pattern 214 has a higher etch resistance to the second etching process than that of the etch stop layer 220, such that the second etching process stops at the metallization pattern 214.

Figure 2I:
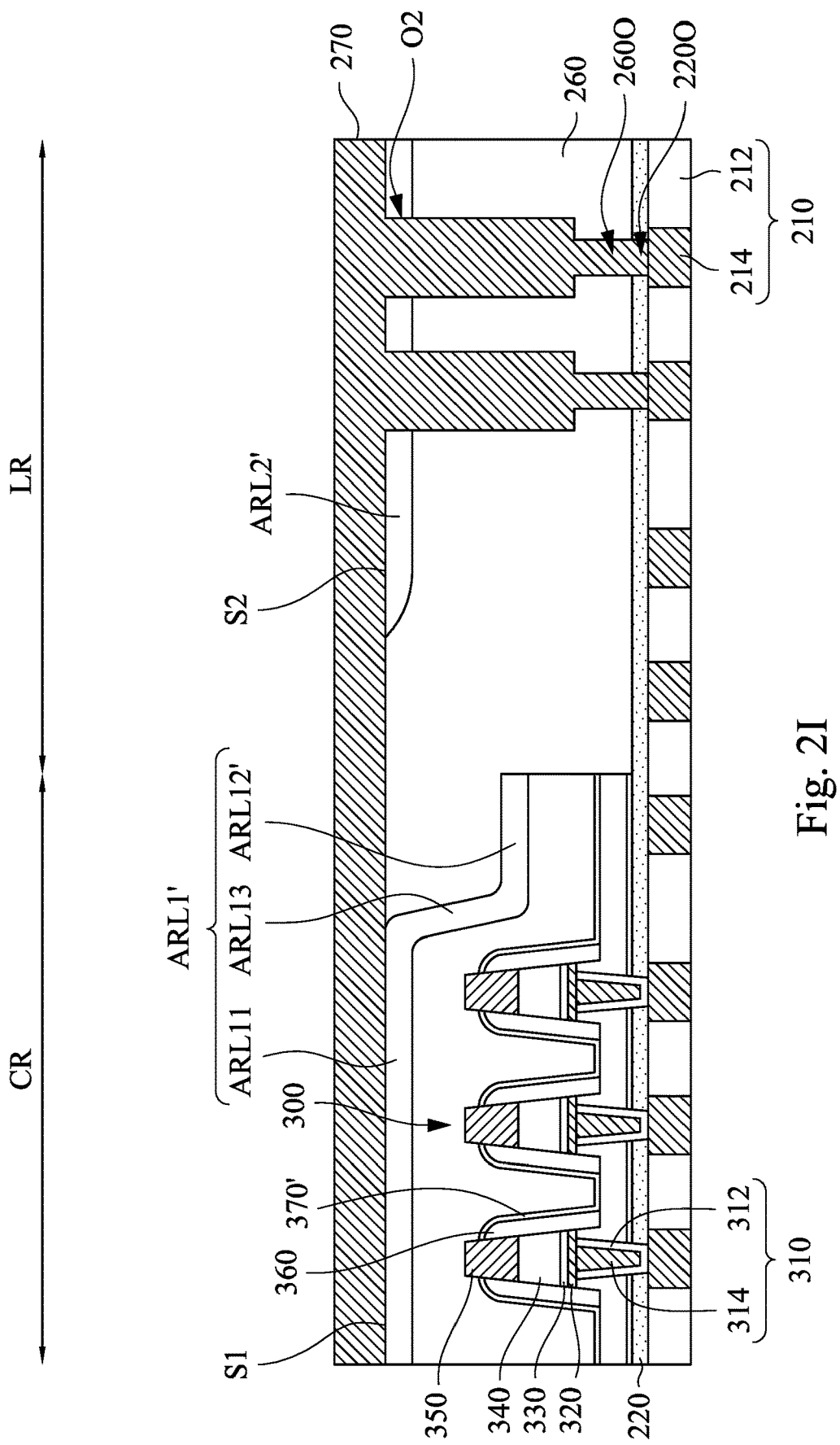

Reference is then made to FIG. 1B and FIG. 2I, where the method 100 proceeds to step 118 where the openings O2, 220O, and 260O are overfilled with a metal material 270. The metal material 270 may include one or more metals (e.g., copper). An excess portion of the metal material 270 outside the openings O2 is formed over the flat top surface (including the surfaces S1 and S2) of the ILD layer 260, the portion ARL11 of the polish stop layer ARL1', and the polish stop layer ARL2'.

Figure 2J:
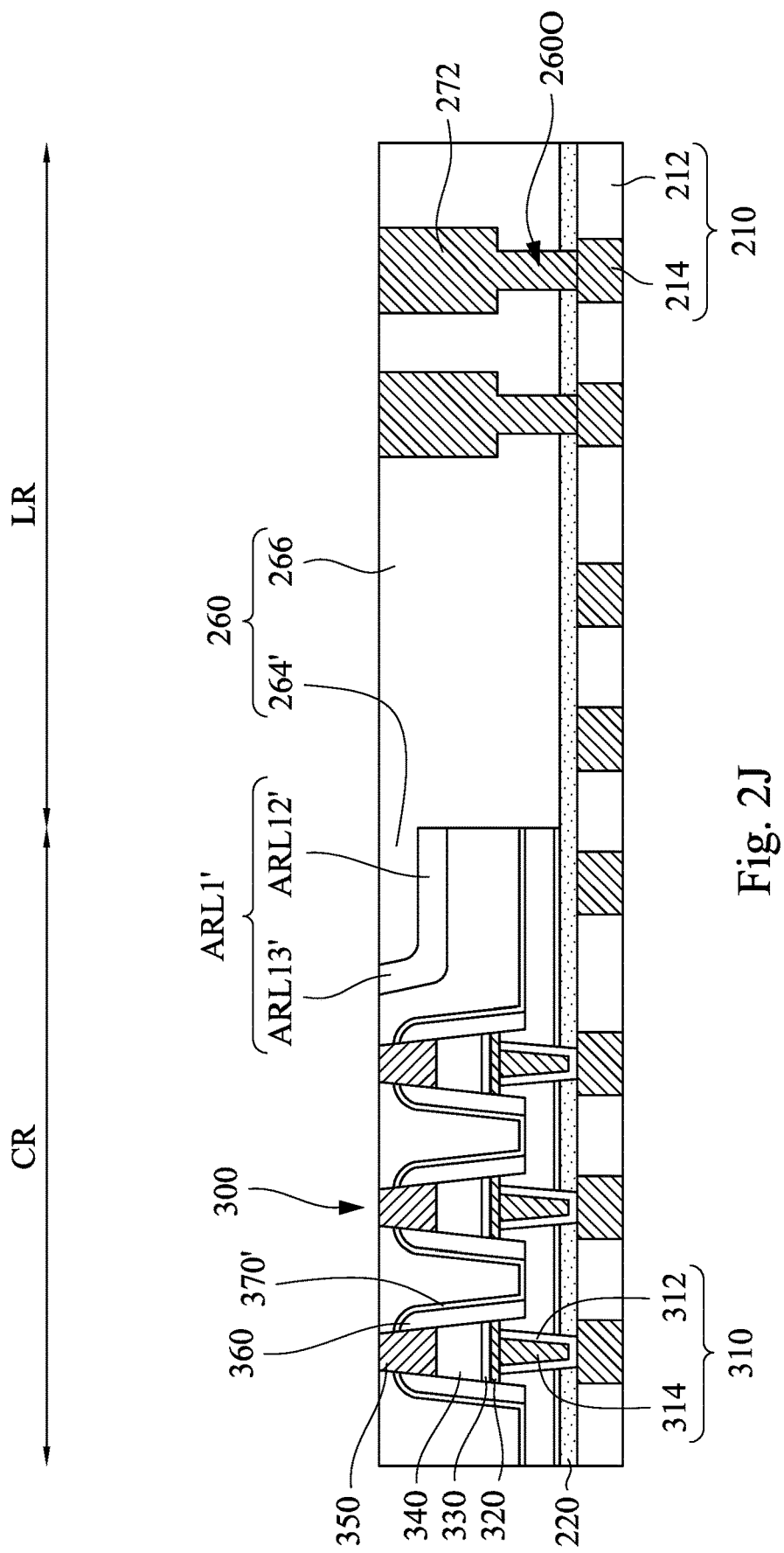

Reference is then made to FIG. 1B and FIG. 2J, where the method 100 proceeds to step 120 where a polishing process is performed to remove the excess portion of the metal material 270 (referring to FIG. 2I) outside the openings 260O and O2 (referring to FIG. 2I), such that remaining portions of the metal material form a metallization pattern 272 in the logic region LR. Through the configuration, the metallization pattern 272 can reach and electrically connect the metallization pattern 214. The polishing process may include a CMP process. Herein, the metal material 270 (referring to FIG. 2I) over the flat surface has a uniform resistance to the CMP process, such that the excess portion of the metal material 270 (referring to FIG. 2I) can be removed without any residue. In some embodiments, the portion ARL11 and a part of the ARL13 of the polish stop layer ARL1' and the polish stop layer ARL2' (referring to FIG. 2I) are also removed by the polishing process, while the other part of the portion ARL13 (which is referred to as the portion ARL13') and the portion ARL12' remain.

In the present disclosure, through the polishing process, the formation of the metallization pattern 272 leaves no metal residue. As such, arcing defects, which are caused by the accumulation of electrons in the certain areas of the dielectric layer and may decrease the yield of usable die, is prevented. Furthermore, short defects in the cell region CR are also prevented.

In some embodiments, the metallization pattern 272 is separated from the MRAM device 300 by a distance in a range of about 50 nanometers to about 1000 nanometers, for example, about 500 nanometers. For example, the metallization pattern 272 is not in contact with a pad of the metallization pattern 214 adjacent the MRAM device 300. However, it should not limit the scope of the present disclosure, in some embodiments, the metallization pattern 272 may be in contact with a pad of the metallization pattern 214 adjacent the MRAM device 300.

Figure 2K:
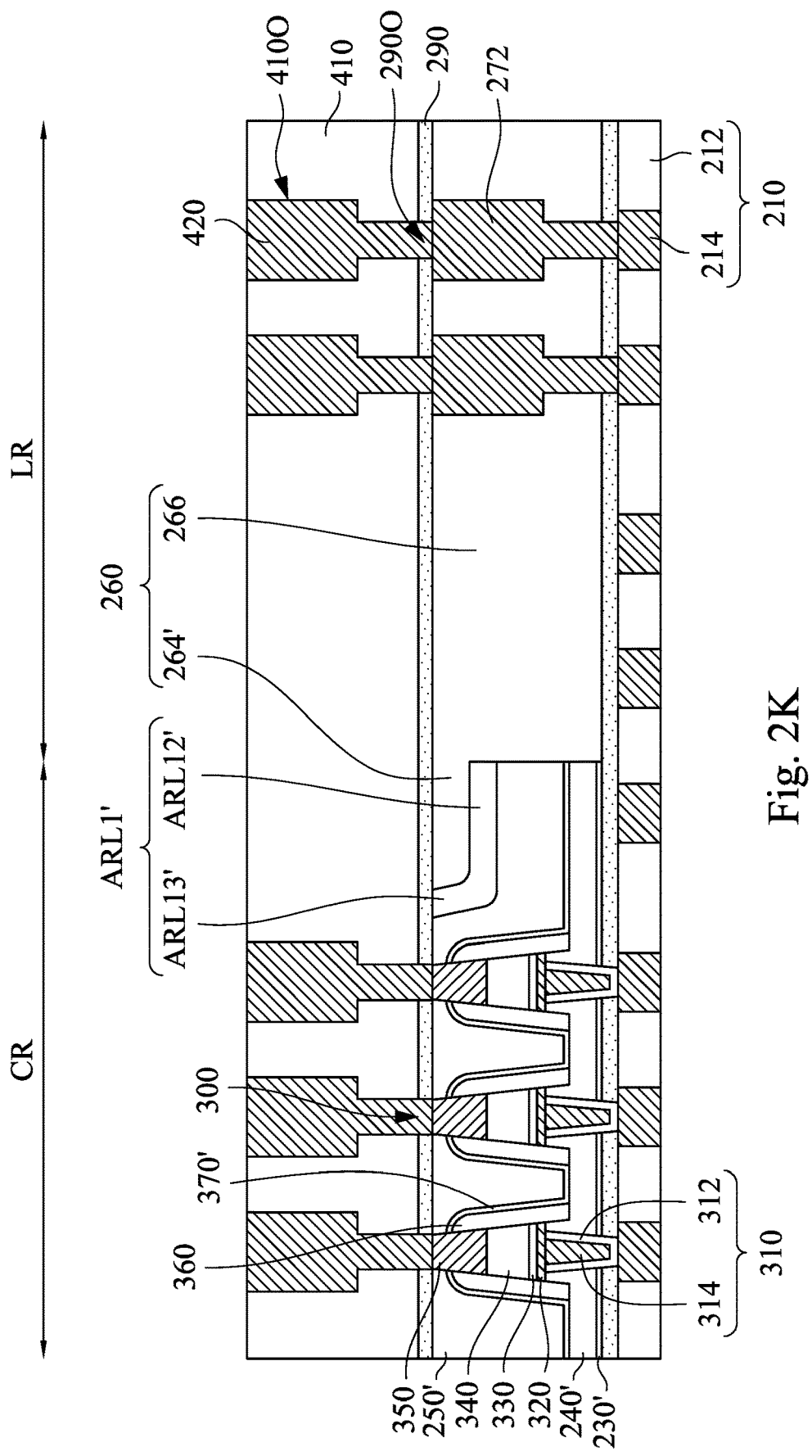

Reference is then made to FIG. 1B and FIG. 2K, where the method 100 proceeds to step 122 where another metallization pattern 420 is formed. The metallization pattern 420 may be connected to the MRAM device 300 and the metallization pattern 272. In some embodiments, an etch stop layer 290 and an ILD layer 410 are formed over the resulting structure of FIG. 2J, holes or openings 290O and 410O are etched in the etch stop layer 290 and the ILD layer 410 respectively, and one or more metals (e.g., copper) are formed in the holes or openings 290O and 410O to form the metallization pattern 420.

The etch stop layer 290 may have the same material as that of the etch stop layer 220. The etch stop layer 290 may be formed of dielectric material different from the underlying ILD layers 250 and 260. For example, the ILD layers 250 and 260 may be a silicon oxide layer, and the etch stop layer 290 may be a silicon nitride layer or a SiC layer.

In some embodiments, the ILD layer 410 may have the same material as the ILD layers 250 and 260. In some other embodiments, the ILD layer 410 may have a different material than the ILD layers 250 and 260. In some embodiments, the ILD layer 410 includes silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof.

In some embodiments, the openings 410O are etched in the ILD layer 410 by a first etching process, and the openings 290O are etched in the etch stop layer 290 by a second etching process. The holes or openings 410O and 290O expose the top surface of the top electrodes 350 in the cell region CR and the metallization pattern 272 in the logic region LR. The etch stop layer 290 has a higher etch resistance to the first etching process than that of the ILD layer 410, such that the first etching process stops at the etch stop layer 290. In some embodiments where the ILD layer 410 is silicon oxide, the etchant used in the first etching process can be dilute hydrofluoric acid (HF), HF, vapor, $CF_4$, $C_4F_8$, $CH_8F_y$, $C_8F_y$, $SF_6$, or $NF_3$, Ar, $N_2$, $O_2$, He, CO, $CO_2$ gas, or other suitable gas. In some embodiments, the top electrodes 350 and the metallization pattern 272 have a higher etch resistance to the second etching process than that of the etch stop layer 290, such that the second etching process stops at the top electrodes 350 and the metallization pattern 272.

After the holes or openings 290O and 410O are filled with metals, a planarization is performed to remove an excess portion of the metals outside the holes or openings 410O, and therefore the metallization pattern 420 is formed. Through the configuration, the metallization pattern 420 can reach and electrically connect the metallization pattern 272 and the top electrodes 350.

In some embodiments of the present disclosure, the polish stop layer ARL1' including portions ARL12' and ARL13' may surround the MRAM devices 300. The polish stop layer ARL1' may terminate at a position where the ILD layer 250', the spacer 370', the dielectric layer 240' and the protective layer 230' terminate. That is, in some embodiments, edges of the polish stop layer ARL1', the ILD layer 250', the spacer 370', the dielectric layer 240', and the protective layer 230' are aligned with each other. Herein, the ILD layer 250' below the polish stop layer ARL1' has a clear interface with the portion 266 of the ILD layer 260 in the logic region LR, while the portion 264' of the ILD layer 260 above the polish stop layer ARL1' is continuously connected with the portion 266 of the ILD layer 260 and does not have a clear interface therebetween. The polish stop layer ARL1', the ILD layer 250', and the portion 266 of the ILD layer 260 may be in contact with a bottom surface of the etch stop layer 290. The polish stop layer ARL1' may be detected by an energy dispersive spectrometer (EDX), secondary ion mass spectrometry (SIMS), or other suitable apparatus.

Figure 3A:
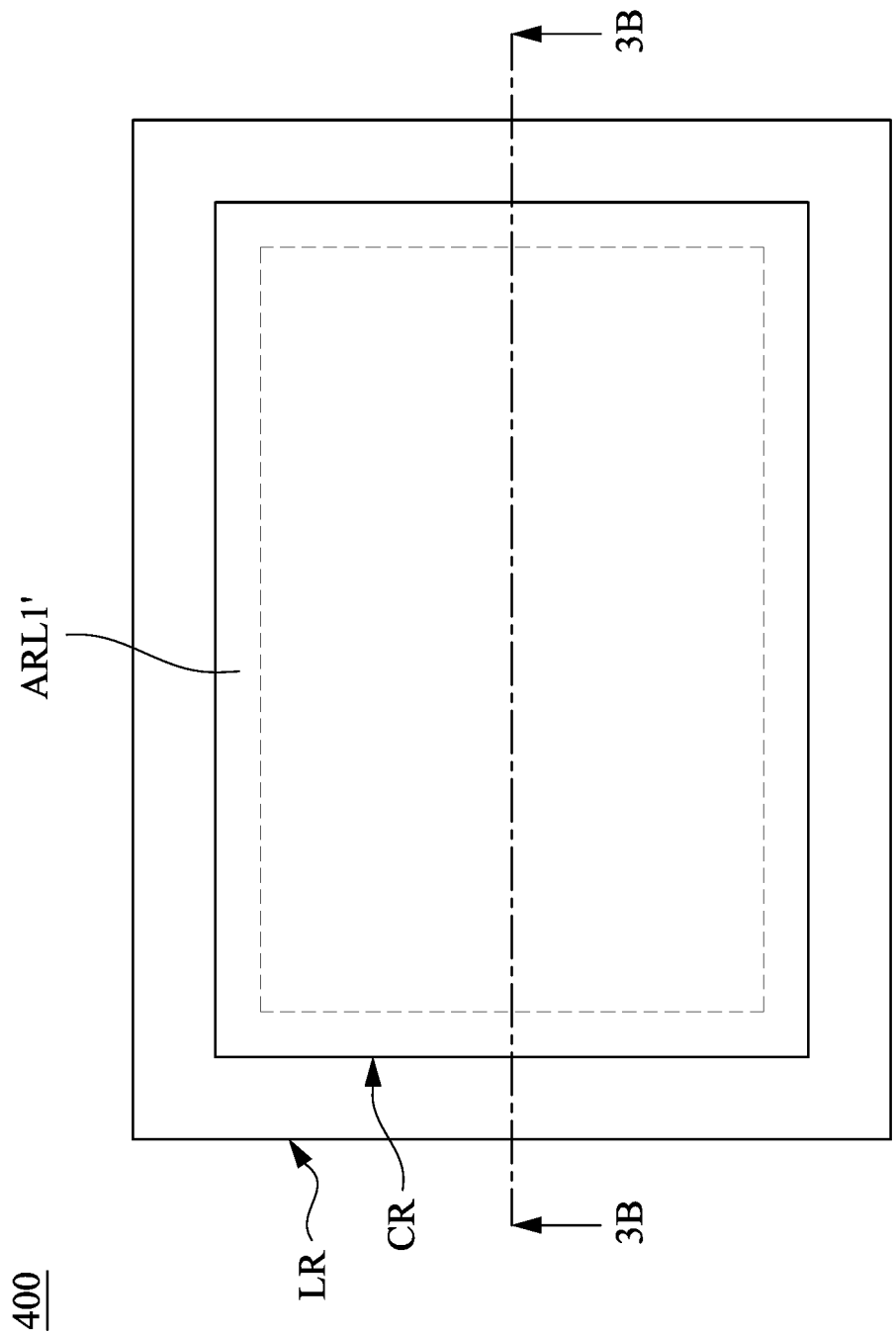
FIG. 3A is a top view of an integrated circuit according to some embodiments of the present disclosure.
Figure 3B:
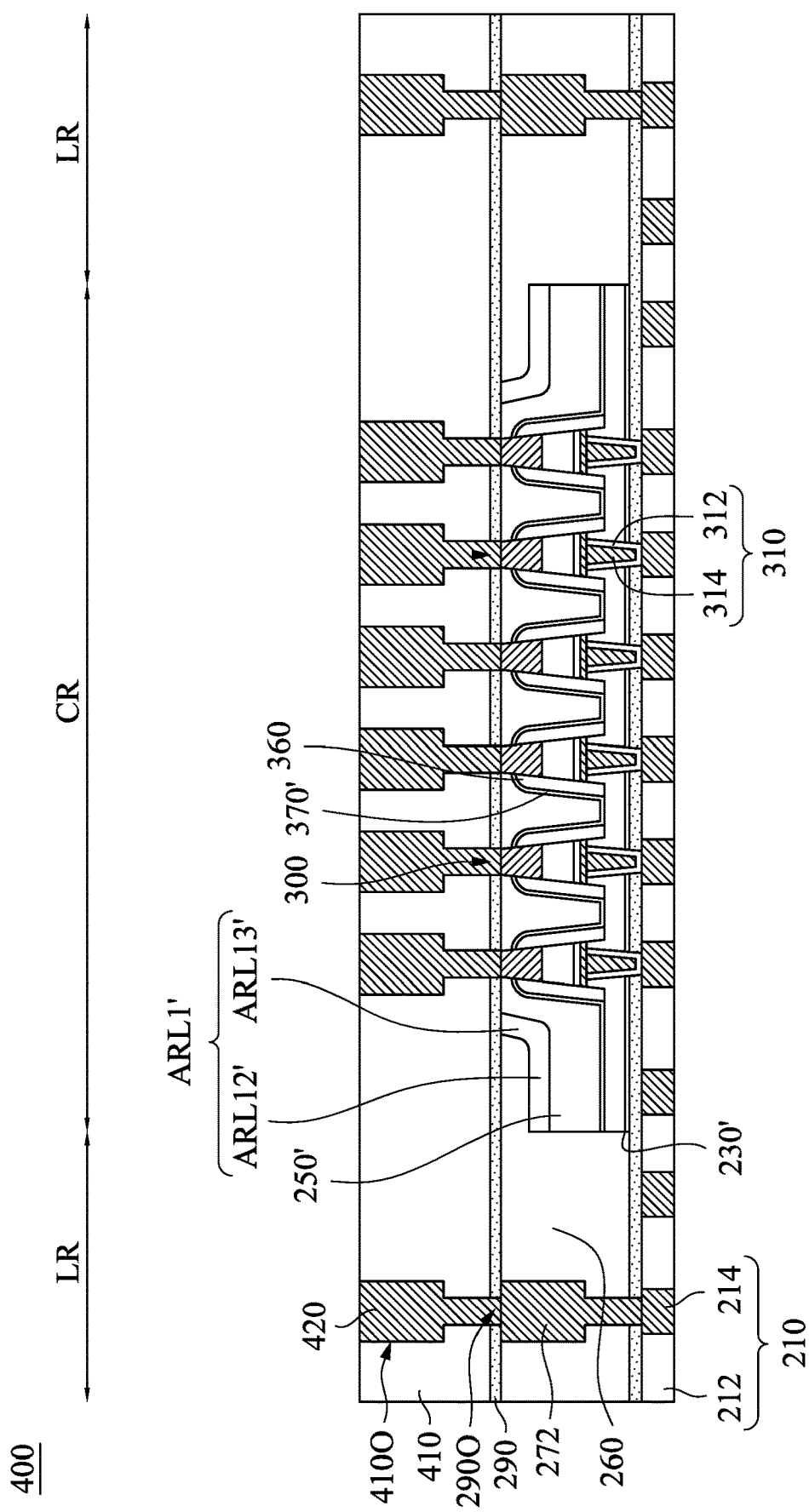
FIG. 3B is a cross-sectional view taken along line 3B-3B of FIG. 3A.

Reference is made to FIGS. 3A and 3B. FIG. 3A is a top view of an integrated circuit 400 according to some embodiments of the present disclosure. FIG. 3B is a cross-sectional view taken along line 3B-3B of FIG. 3A. The integrated circuit 400 may include a cell region CR and a logic region LR surrounding the cell region CR. In some embodiments, the MRAM devices 300 are arrayed in the cell region CR. The metallization pattern 272 connected to logic circuits are disposed in the logic region LR and may surround the array of MRAM devices 300. The ILD layers 250' and 260 surround the MRAM devices 300 and the metallization pattern 272, respectively. The polish stop layer ARL1' is between the ILD layers 250' and 260 and surround the array of MRAM devices 300. Other details of the present embodiments are similar to those mentioned before, and therefore not repeated herein.

Figure 4:
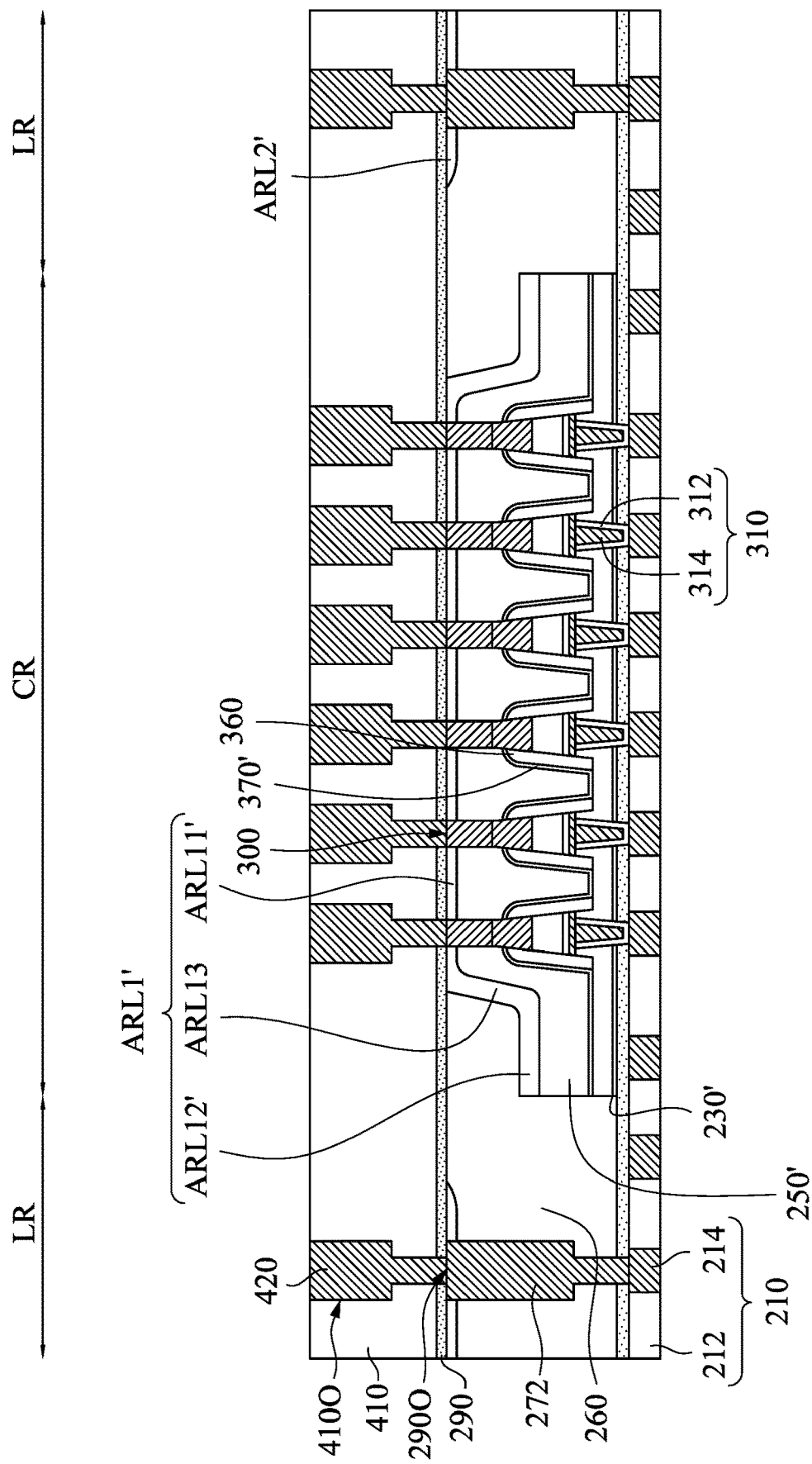
FIG. 4 is a cross-sectional view of an integrated circuit according to some embodiments of the present disclosure.

FIG. 4 is a cross-sectional view of an integrated circuit according to some embodiments of the present disclosure. The present embodiments are similar to the embodiments of FIGS. 3A and 3B, and the difference between the present embodiments and the embodiments of FIGS. 3A and 3B is that: the polish stop layer ARL1' covers the MRAM devices 300. In the present embodiments, the portion ARL11 of the polish stop layer ARL1' (referring to FIG. 2I) is not fully consumed during polishing the metal material 270, such that a part of the portion ARL11 of the polish stop layer ARL1' remains over the ILD layer 250'. The remaining part of the portion ARL11 is referred to as the portion ARL11'. The portion ARL11' may have a thickness different from that of the portion ARL12' of the polish stop layer ARL1' since the portion ARL12' is not polished. Also, the polish stop layer ARL2' is not fully consumed during polishing the metal material 270, such that a part of the polish stop layer ARL2' remains over the ILD layer 260. Subsequently, openings are etched in the portion ARL11' of the polish stop layer ARL1' and the polish stop layer ARL2', such that the metallization pattern 420 may be connected to the MRAM devices 300 and the metallization pattern 272 through the openings of the portion ARL11' and the polish stop layer ARL2', respectively. Other details of the present embodiments are similar to those mentioned before, and therefore not repeated herein.

Figure 5:
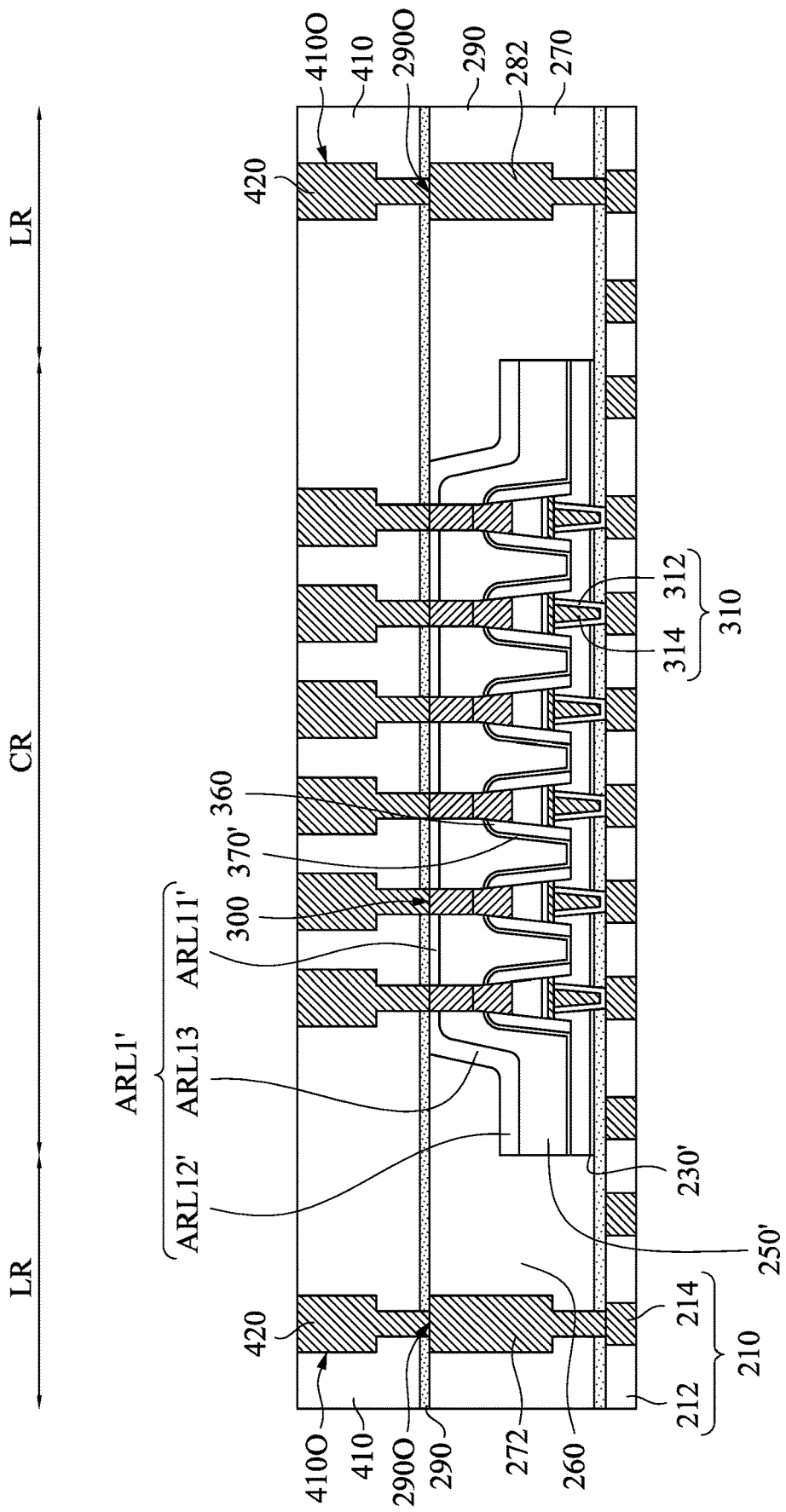
FIG. 5 is a cross-sectional view of an integrated circuit according to some embodiments of the present disclosure.

FIG. 5 is a cross-sectional view of an integrated circuit according to some embodiments of the present disclosure. The present embodiments is similar to the embodiments of FIG. 4, and the difference between the present embodiments and the embodiments of FIG. 4 is that: the vertical positions of the portion ARL11 of the polish stop layer ARL1' and the polish stop layer ARL2' may not be aligned well, such that during polishing the metal material 270 in FIG. 2I, a part of one of the portion ARL11 and the polish stop layer ARL2' may remain while the other of the portion ARL11 and the polish stop layer ARL2' may be fully removed. For example, herein, the polish stop layer ARL2' (referring to FIG. 2I) is fully removed during polishing the metal material 270, while a part of the portion ARL11 (i.e., the portion ARL11') remains over the MRAM devices 300. In some other examples, the portion ARL11 (referring to FIG. 2I) is fully removed during polishing the metal material 270, while the polish stop layers ARL2' (referring to FIG. 2I) remains. Other details of the present embodiments are similar to those mentioned before, and therefore not repeated herein.

Figure 6:
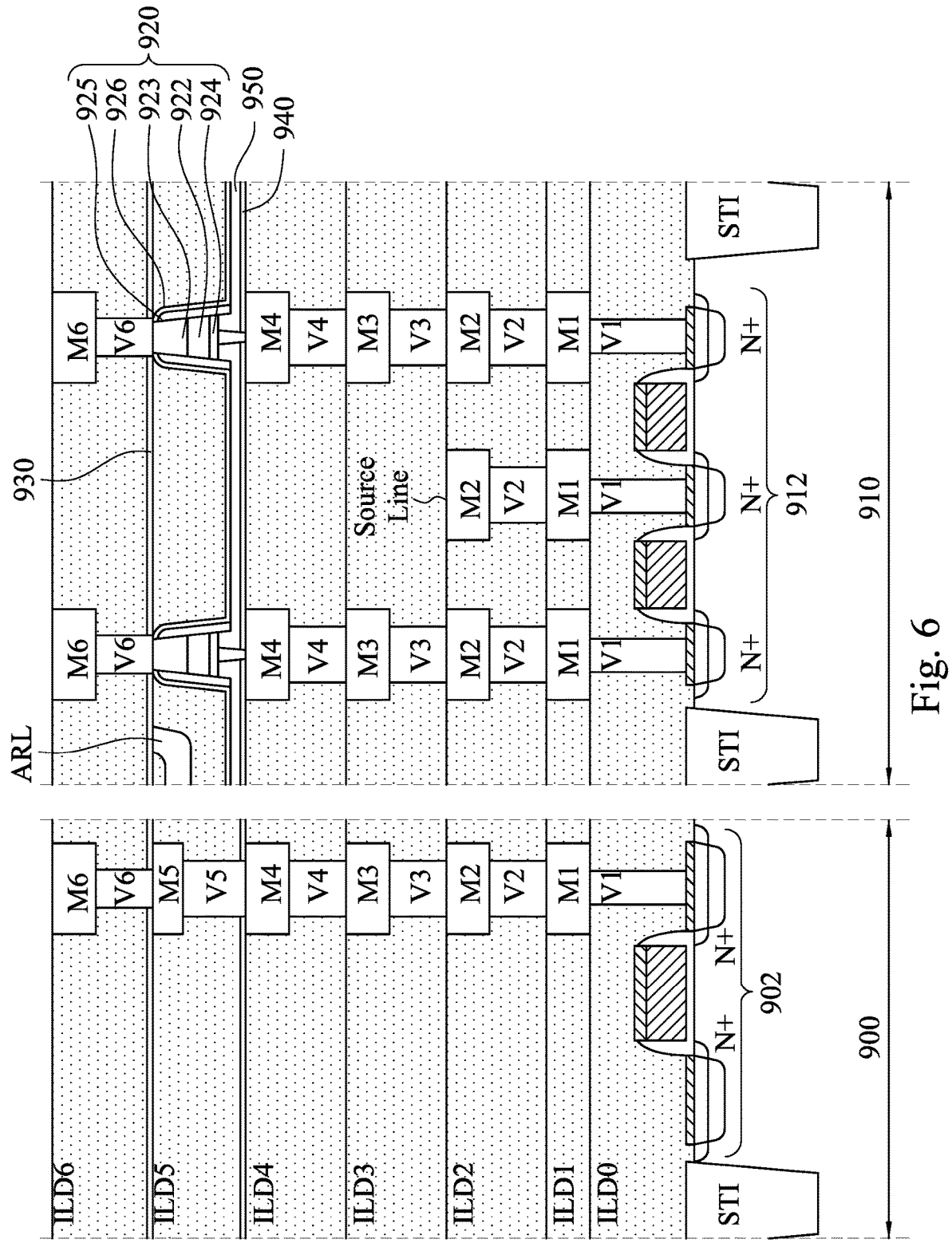
FIG. 6 illustrates an integrated circuit including MRAM devices and logic devices according to some embodiments of the present disclosure.

FIG. 6 illustrates an integrated circuit including MRAM devices and logic devices. The integrated circuit includes a logic region 900 and a MRAM region 910. Logic region 900 may include circuitry, such as the exemplary transistor 902, for processing information received from MRAM devices 920 in the MRAM region 910 and for controlling reading and writing functions of MRAM devices 920. In some embodiments, the MRAM device 920 includes an MTJ stack 922, a top electrode 923 over the MTJ stack 922, and a bottom electrode 924 under the MTJ stack 922, and spacers 925 and 926 surrounds the top electrode 923, the MTJ stack 922, and the bottom electrode 924.

As depicted, the integrated circuit is fabricated using six metallization layers, labeled as M1 through M6, with six layers of metallization vias or interconnects, labeled as V1 through V6. Also included in integrated circuit is a plurality of ILD layers. Seven ILD layers, identified as ILD0 through ILD6 are depicted in FIG. 6 as spanning the logic region 900 and the MRAM region 910. The ILD layers may provide electrical insulation as well as structural support for the various features of the integrated circuit during many fabrication process steps. In some embodiments, in ILD5, a polish stop layer ARL in contact with a bottom surface of the etch stop layer 930 may surround the MRAM devices 920. Other embodiments may contain more or fewer metallization layers and a corresponding more or fewer number of vias. Logic region 900 includes a full metallization stack, including a portion of each of metallization layers M1-M6 connected by interconnects V2-V6, with the interconnect V1 connecting the stack to a source/drain contact of logic transistor 902. The MRAM region 910 includes a full metallization stack connecting MRAM devices 920 to transistors 912 in the MRAM region 910, and a partial metallization stack connecting a source line to transistors 912 in the MRAM region 910. MRAM devices 920 are depicted as being fabricated in between the top of the metallization layer M4 and the bottom of the metallization layer M6. The metallization layer M4 is connected with the bottom electrode 924 through a bottom via in an etch stop layer 940 and a dielectric layer 950, and the metallization layer M6 is connected with the top electrode 923 through the interconnect V6 in the etch stop layer 930.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that an excess portion of the metal material in forming the metallization pattern can be fully removed, thereby preventing arcing defect and short defect. Another advantage is that the layers in cell region are removed by the polishing process, and a mask used for cell etching back is saved.

According to some embodiments of the present disclosure, a method for fabricating an integrated circuit is provided. The method includes depositing a first polish stop layer above a memory device, in which the first polish stop layer has a first portion over the memory device and a second portion that is not over the memory device; removing the second portion of the first polish stop layer; depositing an inter-layer dielectric layer over the first polish stop layer after removing the second portion of the first polish stop layer; and polishing the inter-layer dielectric layer until reaching the first portion of the first polish stop layer.

In some embodiments of the present disclosure, removing the second portion of the first polish stop layer includes forming a resist layer over the first portion of the first polish stop layer; and etching the second portion of the first polish stop layer.

In some embodiments of the present disclosure, forming the first polish stop layer is performed such that the first polish stop layer is an anti-reflection layer.

In some embodiments of the present disclosure, the method further includes forming a second polish stop layer over the inter-layer dielectric layer before polishing the inter-layer dielectric layer. The second polish stop layer is not over the memory device, and the second polish stop layer has a higher resistance to polishing the inter-layer dielectric layer that that of the inter-layer dielectric layer.

In some embodiments of the present disclosure, forming the second polish stop layer includes depositing a polish stop material over the inter-layer dielectric layer; and removing a portion of the polish stop material over the memory device.

In some embodiments of the present disclosure, wherein removing the portion of the polish stop material includes non-conformally forming a coating layer over the polish stop material; and etching back the coating layer and the portion of the polish stop material.

In some embodiments of the present disclosure, forming the second polish stop layer is performed such that the second polish stop layer is an anti-reflection layer.

In some embodiments of the present disclosure, the method further includes forming a metallization pattern in the inter-layer dielectric layer after polishing the inter-layer dielectric layer.

According to some embodiments of the present disclosure, a method for fabricating an integrated circuit includes forming a first polish stop layer above a memory device; depositing a first inter-layer dielectric layer over the first polish stop layer, in which the first inter-layer dielectric layer has a first portion over the first polish stop layer and a second portion that is not over the first polish stop layer; forming a second polish stop layer over the second portion of the first inter-layer dielectric layer, in which the second polish stop layer is not over the first portion of the first inter-layer dielectric layer; and polishing the first inter-layer dielectric layer until reaching at least one of the first polish stop layer and the second polish stop layer.

In some embodiments of the present disclosure, forming the second polish stop layer is performed such that the second polish stop layer is at a position level with that of the first polish stop layer.

In some embodiments of the present disclosure, forming the second polish stop layer is performed such that the second polish stop layer is made of the same material as that of the first polish stop layer.

In some embodiments of the present disclosure, the method further includes forming a second inter-layer dielectric layer around the memory device before depositing the first inter-layer dielectric layer.

In some embodiments of the present disclosure, polishing the first inter-layer dielectric layer is performed such that the first inter-layer dielectric layer has a portion over the second inter-layer dielectric layer.

In some embodiments of the present disclosure, polishing the first inter-layer dielectric layer is performed until reaching the first polish stop layer and the second polish stop layer.

According to some embodiments of the present disclosure, an integrated circuit includes a first inter-layer dielectric layer, plural memory devices, a second inter-layer dielectric layer, and a polish stop layer. The first inter-layer dielectric has plural conductive features therein. The memory devices are respectively over the conductive features. The second inter-layer dielectric layer has a raised portion surrounding the memory devices and an extending portion extending from the raised portion, and the raised portion has a top surface higher than a top surface of the extending portion. The polish stop layer extends over the top surface of the extending portion to a side surface of the raised portion.

In some embodiments of the present disclosure, the polish stop layer further extends over the top surface of the raised portion of the second inter-layer dielectric layer.

In some embodiments of the present disclosure, the polish stop layer is not over the top surface of the raised portion of the second inter-layer dielectric layer.

In some embodiments of the present disclosure, the polish stop layer is an anti-reflection layer.

In some embodiments of the present disclosure, the top surface of the raised portion of the second inter-layer dielectric layer is substantially coplanar with a top end of the polish stop layer.

In some embodiments of the present disclosure, the integrated circuit further includes a dielectric layer over the second inter-layer dielectric layer. The polish stop layer and the second inter-layer dielectric layer are connected with a bottom surface of the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating an integrated circuit, comprising:

depositing a first inter-layer dielectric layer over a memory device, wherein the first inter-layer dielectric layer has a first portion over the memory device and a second portion adjacent the first portion of the first inter-layer dielectric layer;

depositing a first polish stop layer over the first inter-layer dielectric layer, wherein the first polish stop layer has a first portion over the memory device and a second portion over the second portion of the first inter-layer dielectric layer;

removing the second portion of the first polish stop layer and the second portion of the first inter-layer dielectric layer, wherein the first portion of the first polish stop layer is at least partially directly above the first portion of the first inter-layer dielectric layer and a top electrode of the memory device after removing the second portion of the first polish stop layer;

depositing a second inter-layer dielectric layer over the first polish stop layer after removing the second portion of the first polish stop layer and the second portion of the first inter-layer dielectric layer; and polishing the second inter-layer dielectric layer until reaching the first portion of the first polish stop layer.

2. The method of claim 1, wherein removing the second portion of the first polish stop layer comprises:

forming a resist layer over the first portion of the first polish stop layer; and etching the second portion of the first polish stop layer.

3. The method of claim 1, wherein depositing the first polish stop layer is performed such that the first polish stop layer is an anti-reflection layer.

4. The method of claim 1, further comprising:

forming a second polish stop layer over the second inter-layer dielectric layer before polishing the second inter-layer dielectric layer, wherein the second polish stop layer is not over the memory device, and the second polish stop layer has a higher resistance to polishing the second inter-layer dielectric layer than that of the second inter-layer dielectric layer.

5. The method of claim 4, wherein forming the second polish stop layer comprises:

depositing a polish stop material over the second inter-layer dielectric layer; and removing a portion of the polish stop material over the memory device.

6. The method of claim 5, wherein removing the portion of the polish stop material comprises:

non-conformally forming a coating layer over the polish stop material; and etching back the coating layer and the portion of the polish stop material.

7. The method of claim 4, wherein forming the second polish stop layer is performed such that the second polish stop layer is an anti-reflection layer.

8. The method of claim 1, further comprising:

forming a metallization pattern in the second inter-layer dielectric layer after polishing the second inter-layer dielectric layer.

9. A method for fabricating an integrated circuit, comprising:

forming a first polish stop layer above a memory device;

depositing a first inter-layer dielectric layer over the first polish stop layer, wherein the first inter-layer dielectric layer has a first portion over the first polish stop layer and a second portion that is not over the first polish stop layer;

forming a second polish stop layer over the second portion of the first inter-layer dielectric layer, wherein the second polish stop layer is not over the first portion of the first inter-layer dielectric layer, wherein a bottom surface of the first polish stop layer is at least partially at a position higher than a top surface of a top electrode of the memory device after forming the second polish stop layer; and polishing the first inter-layer dielectric layer until reaching at least one of the first polish stop layer and the second polish stop layer.

10. The method of claim 9, wherein forming the second polish stop layer is performed such that the second polish stop layer is at a position level with that of the first polish stop layer.

11. The method of claim 9, wherein forming the second polish stop layer is performed such that the second polish stop layer is made of the same material as that of the first polish stop layer.

12. The method of claim 9, further comprising:
forming a second inter-layer dielectric layer around the memory device before depositing the first inter-layer dielectric layer.

13. The method of claim 9, wherein polishing the first inter-layer dielectric layer is performed such that the first inter-layer dielectric layer has a portion over the first polish stop layer.

14. An integrated circuit, comprising:
a first inter-layer dielectric layer having a plurality of conductive features therein;
a plurality of memory devices respectively over the conductive features, wherein each of the memory devices comprises a bottom electrode, a resistance switching element over the bottom electrode, and a top electrode over the resistance switching element;
a second inter-layer dielectric layer, wherein the second inter-layer dielectric layer has a raised portion surrounding the memory devices and an extending portion extending from the raised portion, and the raised portion has a top surface higher than a top surface of the extending portion; and
a polish stop layer having a first portion extending along the top surface of the extending portion and a second portion extending along a side surface of the raised portion, wherein a top surface of the first portion of the polish stop layer is lower than a top surface of the top electrodes of the memory devices.

15. The integrated circuit of claim 14, wherein the polish stop layer is not over the top surface of the raised portion of the second inter-layer dielectric layer.

16. The integrated circuit of claim 14, wherein the polish stop layer is an anti-reflection layer.

17. The integrated circuit of claim 14, wherein the top surface of the raised portion of the second inter-layer dielectric layer is substantially coplanar with a top end of the second portion of the polish stop layer.

18. The integrated circuit of claim 14, further comprising:
a dielectric layer over the second inter-layer dielectric layer, wherein the polish stop layer and the second inter-layer dielectric layer are connected with a bottom surface of the dielectric layer.

19. The method of claim 9, wherein polishing the first inter-layer dielectric layer is performed such that a top surface of the first polish stop layer is substantially coplanar with a top surface of the second polish stop layer after polishing the first inter-layer dielectric layer.

20. The method of claim 9, wherein polishing the first inter-layer dielectric layer is performed such that a top surface of said at least one of the first polish stop layer and the second polish stop layer is substantially coplanar with a top surface of the first inter-layer dielectric layer after polishing the first inter-layer dielectric layer.

* * * * *